United States Patent
Sawaki et al.

(10) Patent No.: US 8,809,847 B2
(45) Date of Patent: Aug. 19, 2014

(54) PHOTOELECTRIC CONVERSION DEVICE AND IMAGING DEVICE

(75) Inventors: Daigo Sawaki, Kanagawa (JP); Katsuyuki Yofu, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/636,853

(22) PCT Filed: Mar. 22, 2011

(86) PCT No.: PCT/JP2011/056829
§ 371 (c)(1),
(2), (4) Date: Sep. 24, 2012

(87) PCT Pub. No.: WO2011/118578
PCT Pub. Date: Sep. 29, 2011

(65) Prior Publication Data
US 2013/0015435 A1 Jan. 17, 2013

(30) Foreign Application Priority Data

Mar. 24, 2010 (JP) .................... 2010-068954
Nov. 12, 2010 (JP) .................... 2010-254264

(51) Int. Cl.
| | | |
|---|---|---|
| H01L 31/062 | (2012.01) | |
| H01L 31/113 | (2006.01) | |
| H01L 27/14 | (2006.01) | |
| H01L 31/00 | (2006.01) | |
| H01L 29/08 | (2006.01) | |
| H01L 35/24 | (2006.01) | |

(52) U.S. Cl.
USPC ............ 257/40; 257/431; 257/292; 257/440; 438/82; 438/98; 438/421

(58) Field of Classification Search
CPC ............ H01L 27/307; H01L 51/4253; H01L 51/0046
USPC .................. 257/40, 431, E51.012, E51.026, 257/E51.001, 292, 440; 438/421, 780, 82, 438/98
See application file for complete search history.

(56) References Cited

U.S. PATENT DOCUMENTS

| | | | |
|---|---|---|---|
| 2006/0159611 A1* | 7/2006 | Hummelen et al. | 423/445 B |
| 2006/0196533 A1* | 9/2006 | Maehara | 136/243 |

(Continued)

FOREIGN PATENT DOCUMENTS

| | | |
|---|---|---|
| JP | 1-34509 B2 | 7/1989 |
| JP | 2007-258235 A | 10/2007 |

(Continued)

OTHER PUBLICATIONS

Written Opinion [PCT/ISA/237] dated Jun. 14, 2011 from the International Searching Authority in counterpart application No. PCT/JP2011/056829.

(Continued)

*Primary Examiner* — Shaun Campbell
*Assistant Examiner* — Thai T Vuong
(74) *Attorney, Agent, or Firm* — Sughrue Mion, PLLC

(57) ABSTRACT

A photoelectric conversion device includes an organic photoelectric conversion layer, and suppresses sensitivity degradation caused by the light irradiation. A photoelectric conversion device 100 is formed by stacking a first electrode layer 104, a photoelectric conversion layer 15 including an organic material, and a second electrode layer 108 on a substrate 101, in which the photoelectric conversion layer 15 has a bulk hetero structure of a P-type organic semiconductor and an N-type organic semiconductor, and a difference between an ionization potential of the P-type organic semiconductor and an apparent ionization potential of the bulk hetero structure is 0.50 eV or less. Accordingly, it is possible to suppress sensitivity degradation caused by the light irradiation.

11 Claims, 2 Drawing Sheets

(56) References Cited

U.S. PATENT DOCUMENTS

| | | | |
|---|---|---|---|
| 2006/0278869 A1* | 12/2006 | Hioki et al. | 257/40 |
| 2007/0044929 A1* | 3/2007 | Mohan et al. | 162/158 |
| 2007/0052051 A1* | 3/2007 | Osaka et al. | 257/440 |
| 2007/0205477 A1 | 9/2007 | Yokoyama | |
| 2008/0035965 A1 | 2/2008 | Hayashi et al. | |
| 2009/0050881 A1 | 2/2009 | Hayashi | |
| 2009/0101953 A1* | 4/2009 | Hayashi et al. | 257/292 |
| 2009/0140123 A1* | 6/2009 | Shen et al. | 250/206 |
| 2009/0188547 A1* | 7/2009 | Hayashi et al. | 136/249 |
| 2009/0189058 A1 | 7/2009 | Mitsui et al. | |
| 2009/0223566 A1* | 9/2009 | Mitsui et al. | 136/263 |
| 2009/0315136 A1 | 12/2009 | Hayashi | |
| 2011/0005597 A1* | 1/2011 | Sato et al. | 136/263 |
| 2011/0049492 A1* | 3/2011 | Sawaki et al. | 257/40 |
| 2011/0068254 A1* | 3/2011 | Hayashi | 250/208.1 |
| 2012/0025179 A1 | 2/2012 | Mitsui et al. | |

FOREIGN PATENT DOCUMENTS

| | | | |
|---|---|---|---|
| JP | 2007-273945 A | 10/2007 | |
| JP | 3986697 B2 | 10/2007 | |
| JP | 2008-72090 A | 3/2008 | |
| JP | 200923982 A | 2/2009 | |
| JP | 200946477 A | 3/2009 | |
| JP | 200949278 A | 3/2009 | |
| JP | 2009-99866 A | 5/2009 | |
| JP | 2009-105336 A | 5/2009 | |
| JP | 2009-200482 A | 9/2009 | |
| JP | 2009272528 A | 11/2009 | |
| JP | 20103901 A | 1/2010 | |

OTHER PUBLICATIONS

Office Action, dated Oct. 23, 2012, issued by the Japanese Patent Office in counterpart Japanese Patent Application No. 2010-254264.

Office Action dated Jan. 22, 2013 issued by the Japanese Patent Office in counterpart Japanese Application No. 2010-254264.

Office Action, dated Nov. 22, 2011, issued by the Japanese Patent Office in counterpart Application No. 2010-254264.

Office Action, dated Jun. 7, 2011, issued by Japanese Patent Office in counterpart Application No. 2010-254264.

International Search Report dated Jun. 14, 2011, issued by the International Searching Authority in International Application No. PCT/JP2011/056829 (PCT/ISA/210).

Written Opinion dated Jun. 14, 2011, issued by the International Searching Authority in International Application No. PCT/JP2011/056829 (PCT/ISA/237).

* cited by examiner

US 8,809,847 B2

PHOTOELECTRIC CONVERSION DEVICE AND IMAGING DEVICE

TECHNICAL FIELD

The present invention relates to a photoelectric conversion device including an organic layer as a photoelectric conversion layer, and an imaging device.

BACKGROUND ART

As an image sensor used in a digital still camera, a digital video camera, a camera for mobile phones, a camera for endoscopy and the like, a solid-state imaging device (so-called CCD sensor or CMOS sensor) is widely known in which pixels including photodiodes are arranged on a semiconductor substrate such as a silicon chip, and signal charges corresponding to photoelectrons generated in the photodiodes of each of the pixels are obtained in a CCD-type or CMOS-type reading circuit.

In the solid-state imaging device, in addition to the photodiodes, signal reading circuit and accompanying wiring thereof are formed in each of the pixels on the semiconductor substrate. Accordingly, as the pixels become miniaturized, the region of the signal reading circuit or the wire occupied in each single pixel is relatively widened, causing a problem of "reduction in aperture ratio" in which a light receiving area of the photodiode is reduced. The reduction in aperture ratio leads to a reduction in sensitivity.

Accordingly, Patent Document 1 proposes "a stack type solid-state imaging device" in which an aperture ratio is improved by stacking a photoelectric conversion layer on an upper side of a semiconductor substrate where each signal reading circuit and wiring are formed. For example, the constitution is such that a plurality of photoelectric conversion devices including a pixel electrode formed on the semiconductor substrate, a photoelectric conversion layer formed on the pixel electrode, and a counter electrode formed on the photoelectric conversion layer are arranged on a surface in parallel to the semiconductor substrate. In the photoelectric conversion device, an exciton generated in the photoelectric conversion layer according to the quantity of incident light is dissociated into an electron and a hole by applying a bias voltage between the pixel electrode and the counter electrode, and signals according to electric charges of the electrons or the holes that move to the pixel electrode according to the bias voltage are read out to the outside by a CCD-type or CMOS-type signal reading circuit installed on the semiconductor substrate.

The photoelectric conversion device is a device that generates electric charges in a photoelectric conversion layer in accordance with light incident from the side of a transparent electrode having light transmittance of a pair of electrodes, and reads out the generated electric charges as signal electric charges from the electrode. Exemplary photoelectric conversion devices are disclosed in Patent Documents 1 to 4. Further, Patent Documents 2 and 3 discloses a constitution using the photoelectric conversion layer formed of the organic semiconductor. Since the photoelectric conversion layer constituted by the organic semiconductor has a large absorption coefficient, the photoelectric conversion layer can be made thin, such that it is possible to realize a photoelectric conversion device in which electric charge diffusion to adjacent pixels rarely occurs, and optical color mixing and electric color mixing (crosstalk) can be reduced. A transparent conductive oxide manufactured on a glass substrate is used as a lower electrode.

However, the photoelectric conversion devices including a P-type organic semiconductor and an N-type organic semiconductor described in Patent Documents 1, 2 and 3 have a problem in view of durability because the device is likely to be structurally deteriorated, and need to be improved because sensitivity is deteriorated caused by the light irradiation.

In order to solve the above problems, Patent Document 4 discloses a stack structure of a fullerene deposited film and a fullerene polymerized film formed between two electrodes, in which deterioration of the film structure due to an unstable bond caused by intermolecular force of $C_{60}$ molecules of the fullerene deposited film is overcome by the fullerene polymerized film. By using the characteristics of a thin film of fullerene, a sensor having improved physical and chemical stability is provided, while maintaining a performance operable at room temperature with improved durability.

However, from the present inventors' review, it is obvious that deterioration of sensitivity caused by the light irradiation cannot be suppressed by only using the method of Patent Document 4.

In addition, the solid-state imaging device is described as an example, but the problems of sensitivity deterioration equally occur even in a photoelectric conversion device used in a solar cell and the like.

RELATED ART

Patent Document

Patent Document 1: Japanese Patent Application Publication No. 1-34509
Patent Document 2: Japanese Patent Application Laid-Open No. 2008-72090
Patent Document 3: Japanese Patent Application Laid-Open No. 2007-273945
Patent Document 4: Japanese Patent No. 3986697

DISCLOSURE OF INVENTION

Problems to Be Solved by the Invention

An object of the present invention is to provide a photoelectric conversion device and an imaging device that can suppress sensitivity deterioration caused by the light irradiation.

Means for Solving the Problems

A photoelectric conversion device according to the present invention is formed by stacking a first electrode layer, a photoelectric conversion layer including an organic material, and a second electrode layer on a substrate, where the photoelectric conversion layer has a bulk hetero structure of a P-type organic semiconductor and an N-type organic semiconductor, and a difference between an ionization potential of the P-type organic semiconductor and an apparent ionization potential of the bulk hetero structure is 0.50 eV or less.

An imaging device according to the present invention is characterized by the use of the photoelectric conversion device.

Effects of the Invention

The present inventors assumed that, as a factor of sensitivity deterioration caused by the light irradiation, a difference between an ionization potential of a P-type organic semiconductor and the apparent ionization potential of a bulk hetero structure has an effect, and by using the constitution, it was possible to suppress sensitivity deterioration caused by the light irradiation. In addition, it was possible to improve an SN ratio as well by applying the constitution to an imaging device.

EMBODIMENTS FOR CARRYING OUT THE INVENTION

Hereinafter, an embodiment of the present invention will be described with reference to the drawings.

Figure 1:
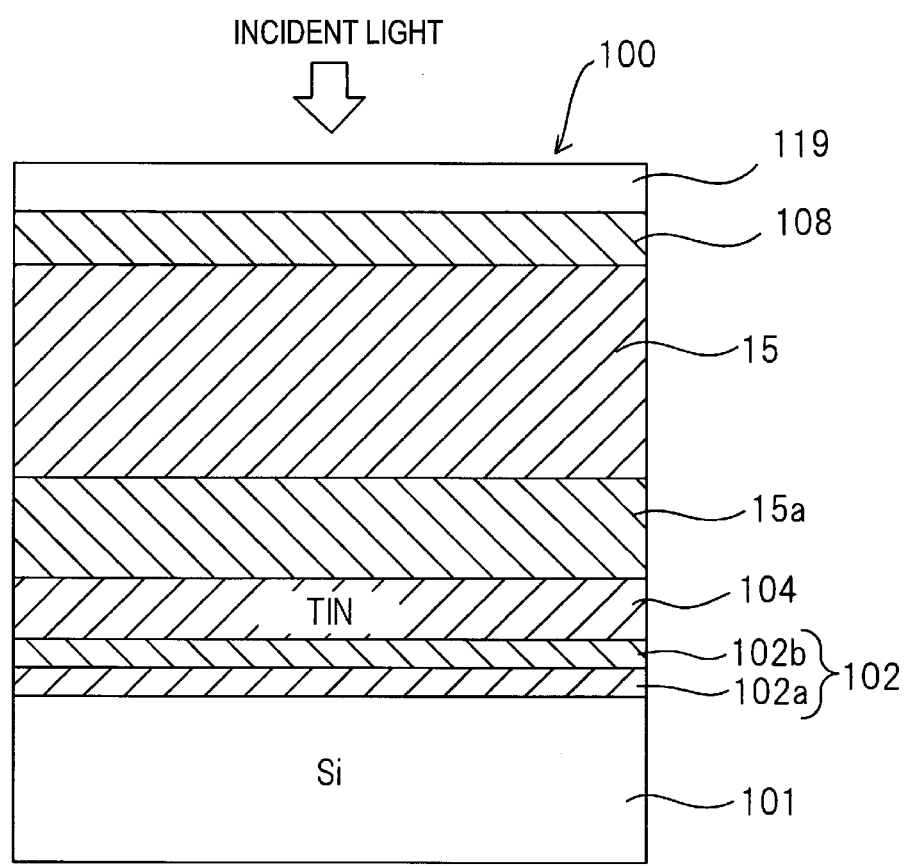
FIG. 1 is a cross-sectional view schematically illustrating a photoelectric conversion device according to a first embodiment of the present invention.

FIG. 1 is a cross-sectional view schematically illustrating an example of a constitution example of a photoelectric conversion device. The photoelectric conversion device 100 illustrated in FIG. 1 is constituted by sequentially stacking a substrate 101, a dielectric layer 102 formed on the substrate 101, a lower electrode 104 provided on the insulating layer 102, an electric charge blocking layer 15a, a photoelectric conversion layer 15, and a transparent electrode (hereinafter, referred to as an "upper electrode") 108 serving as an upper electrode in this order.

Further, the photoelectric conversion device 100 may be constituted by only the lower electrode 104, the photoelectric conversion layer 15, and the upper electrode 108, or may further include another layer in addition these layers. Herein, the photoelectric conversion layer 15 and the electric charge blocking layer 15a are called an organic layer. The organic layer is a layer including at least one organic material.

The dielectric layer 102 is constituted by sequentially stacking a thermal oxide film (Th—$SiO_2$) 102a and an inter metal dielectric (IMD) 102b on the substrate 101. Further, constitution of the dielectric layer 102 is not limited thereto.

The electric charge blocking layer 15a has a function of suppressing the injection of a carrier from the lower electrode 104 into the photoelectric conversion layer 15. Further, the electric charge blocking layer 15a may be formed between the photoelectric conversion layer 15 and the upper electrode 108. Alternatively, the electric charge blocking layer 15a may be formed between the lower electrode 104 and the upper electrode 108, and the photoelectric conversion layer 15, respectively.

A protection film 119 formed of silicon oxide (SiO) and the like is formed on the upper electrode 108.

In the photoelectric conversion device 100 illustrated in FIG. 1, light is incident from an upper side of the transparent upper electrode 108. Further, in the photoelectric conversion device 100, a bias voltage is applied between the lower electrode 104 and upper electrode 108 so that among electric charges (holes and electrons) generated in the photoelectric conversion layer 15, the electrons are moved to the upper electrode 108, and the holes are moved to the lower electrode 104. That is, the upper electrode 108 is used as an electron collection electrode, and the lower electrode 104 is used as a hole collection electrode. Further, the upper electrode 108 may be used as the hole collection electrode, and the lower electrode 104 may be used as the electron collection electrode.

[Photoelectric Conversion Layer]

In the photoelectric conversion device 100 formed by providing, on the substrate, the lower electrode, the photoelectric conversion layer formed of the organic layer, and the upper electrode including the transparent electrode material, the present embodiment is characterized in that the photoelectric conversion layer 15 formed of the organic layer has a bulk hetero structure of a P-type organic semiconductor and an N-type organic semiconductor, and a difference between an ionization potential of the P-type organic semiconductor and an apparent ionization potential of the bulk hetero structure is 0.50 eV or less. The apparent ionization potential of the bulk hetero structure means an ionization potential of a complex when the P-type organic semiconductor and the N-type organic semiconductor are mixed with each other, and may be measured by, for example, AC-2 that is a photoelectron spectroscopy in the atmosphere.

Exciton dissociation efficiency may be increased by mixing and bonding the P-type organic semiconductor and the N-type organic semiconductor to form a bulk hetero structure where a donor acceptor interface is three-dimensionally widened in the layer. Therefore, the photoelectric conversion layer 15 having the constitution where the P-type organic semiconductor and the N-type organic semiconductor are bonded exhibits high photoelectric conversion efficiency. Particularly, the photoelectric conversion layer 15 including the bulk hetero structure where the P-type organic semiconductor and the N-type organic semiconductor are mixed with each other is preferred because a junction interface is increased to improve the photoelectric conversion efficiency.

Hereinafter, each of the materials will be described.

(P-Type Organic Semiconductor)

The P-type organic semiconductor (compound) is a donor-type organic semiconductor (compound), mainly represented by a hole transporting organic compound, and an organic compound having a property of easily donating electrons. More specifically, the P-type organic semiconductor material is an organic compound having a lower ionization potential when two organic materials are used in contact with each other. Accordingly, the donor-type organic compound may be any organic compound as long as the organic compound is an electron-donating organic compound.

For example, a metal complex having a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, merocyanine compound, an oxonol compound, a polyamine compound, an indole compound, a pyrrole compound, a pyrazole compound, a polyarylene compound, a condensed aromatic carbon ring compound (a naphthalene derivative, an anthracene derivative, a phenanthrene derivative, a tetracene derivative, a pyrene derivative, a perylene derivative, and a fluoranthene derivative), or a heterocyclic compound containing nitrogen as a ligand and like may be used. Further, the examples are not limited thereto, and, as described as above, any organic compound may be used as a donor-type organic semiconductor as long as the organic compound is an organic compound having the ionization potential that is lower than that of the organic compound used as the N-type (acceptor-type) compound.

Further, two or more kinds of compounds may be used as the P-type organic semiconductor. In the present invention, it is preferred that two or more kinds of P-type organic semiconductors are used, it is more preferred that at least one kind thereof is a triarylamine compound, and it is even more preferred that at least one kind thereof is a triarylamine compound and at least one other kind thereof is a styrylamine compound.

In addition, it is preferred that the P-type organic semiconductor is a dye, and examples of the dye type may include a triarylamine compound and a styrylamine compound.

Furthermore, it is preferred that the P-type organic semiconductor is a dye type compound represented by the following Formula 1.

[Chem. 1]

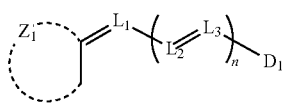

Formula (1)

(wherein, in the formula, $Z_1$ is a ring including at least two carbon atoms and represents a 5-membered ring, a 6-membered ring, or a condensed ring containing at least one of the 5-membered ring and the 6-membered ring. Each of $L_1$, $L_2$ and $L_3$ independently represents an unsubstituted methine group or a substituted methine group. $D_1$ represents an atom group. n represents an integer of 0 or more.)

$Z_1$ is a ring including at least two carbon atoms and represents a 5-membered ring, a 6-membered ring, or a condensed ring containing at least one of the 5-membered ring and the 6-membered ring. It is preferred that, as the 5-membered ring, the 6-membered ring, or the condensed ring containing at least one of the 5-membered ring and the 6-membered ring, those which are generally used as an acidic nucleus in a merocyanine dye are preferable, and specific examples thereof include the followings.

(a) 1,3-dicarbonyl nucleus: for example, 1,3-indandione nucleus, 1,3-cyclohexanedione, 5,5-dimethyl-1,3-cyclohexanedione, 1,3-dioxane-4,6-dione and the like.

(b) pyrazolinone nucleus: for example, 1-phenyl-2-pyrazoline-5-one, 3-methyl-1-phenyl-2-pyrazoline-5-one, 1-(2-benzothiazoyl)-3-methyl-2-pyrazoline-5-one and the like.

(c) isoxazolinone nucleus: for example, 3-phenyl-2-isoxazoline-5-one, 3-methyl-2-isoxazoline-5-one and the like.

(d) oxyindole nucleus: for example, 1-alkyl-2,3-dihydro-2-oxyindole and the like.

(e) 2,4,6-triketohexahydropyrimidine nucleus: for example, barbituric acid or 2-thiobarbituric acid and derivatives thereof. Examples of the derivatives may include a 1-alkyl derivative such as 1-methyl and 1-ethyl, a 1,3-dialkyl derivative such as 1,3-dimethyl, 1,3-diethyl, and 1,3-dibutyl, a 1,3-diaryl derivative such as 1,3-diphenyl, 1,3-di(p-chlorophenyl), and 1,3-di(p-ethoxycarbonylphenyl), a 1-alkyl-1-aryl derivative such as 1-ethyl-3-phenyl, a 1,3-diheterocyclic-substituted derivative such as 1,3-di(2-pyridyl) and the like.

(f) 2-thio-2,4-thiazolidinedione nucleus: for example, laudanine, derivatives thereof and the like. Examples of the derivatives may include 3-alkyllaudanine such as 3-methyl-laudanine, 3-ethyllaudanine, and 3-allyllaudanine, 3-aryl-laudanine such as 3-phenyllaudanine, 3-heterocyclic-substituted laudanine such as 3-(2-pyridyl)laudanine and the like.

(g) 2-thio-2,4-oxazolidinedione (2-thio-2,4-(3H,5H)-oxazoledione) nucleus: for example, 3-ethyl-2-thio-2,4-oxazolidinedione and the like.

(h) thianaphthenone nucleus: for example, 3(2H)-thianaphthenone-1,1-dioxide and the like.

(i) 2-thio-2,5-thiazolidinedione nucleus: for example, 3-ethyl-2-thio-2,5-thiazolidinedione and the like.

(j) 2,4-thiazolidinedione nucleus: for example, 2,4-thiazolidinedione, 3-ethyl-2,4-thiazolidinedione, 3-phenyl-2,4-thiazolidinedione and the like.

(k) thiazoline-4-one nucleus: for example, 4-thiazolidone, 2-ethyl-4-thiazolinone and the like.

(l) 2,4-imidazolidinedione (hidantoin) nucleus: for example, 2,4-imidazolidinedione, 3-ethyl-2,4-imidazolidinedione and the like.

(m) 2-thio-2,4-imidazolidinedione (2-thiohidantoin) nucleus: for example, 2-thio-2,4-imidazolidinedione, 3-ethyl-2-thio-2,4-imidazolidinedione and the like.

(n) imidazoline-5-one nucleus: for example, 2-propylmercapto-2-imidazoline-5-one and the like.

(o) 3,5-pyrazolidinedione nucleus: for example, 1,2-diphenyl-3,5-pyrazolidinedione, 1,2-dimethyl-3,5-pyrazolidinedione and the like.

(p) benzothiophene-3-one nucleus: for example, benzothiophene-3-one, oxobenzothiophene-3-one, dioxobenzothiophene-3-one and the like.

(q) indanone nucleus: for example, 1-indanone, 3-phenyl-1-indanone, 3-methyl-1-indanone, 3,3-diphenyl-1-indanone, 3,3-dimethyl-1-indanone, 3-dicyanomethylene-1-indanone and the like.

(r) indane nucleus: 1,3-dicyanomethyleneindan and the like (s) pyran nucleus: 2-methyl-4-dicyanomethylene-4H pyran and the like The ring represented by $Z_1$ is preferably a 1,3-dicarbonyl nucleus, a pyrazolinone nucleus, a 2,4,6-triketohexahydropyrimidine nucleus (including a thioketone body, for example, a barbituric acid nucleus, and a 2-thiobarbituric acid nucleus), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazoline-5-one nucleus, a 3,5-pyrazolidinedione nucleus, a benzothiophene-3-one nucleus, an indanone nucleus, an indane nucleus, and a pyran nucleus, and more preferably a 1,3-dicarbonyl nucleus, a 2,4,6-triketohexahydropyrimidine nucleus (including a thioketone body, for example, a barbituric acid nucleus, and a 2-thiobarbituric acid nucleus), a 3,5-pyrazolidinedione nucleus, a benzothiophene-3-one nucleus, an indanone nucleus, an indane nucleus, and a pyran nucleus, and more preferably a 1,3-dicarbonyl nucleus, a 2,4,6-triketohexahydropyrimidine nucleus (including a thioketone body, for example, a barbituric acid nucleus, and a 2-thiobarbituric acid nucleus), and particularly preferably a 1,3-indandione nucleus, an indanone nucleus, an indane nucleus and a pyran nucleus.

Each of $L_1$, $L_2$ and $L_3$ independently represents an unsubstituted methine group or a substituted methine group. A ring (e.g. a 6-membered ring, for example, a benzene ring) may be formed by bonding the substituted methine groups. The substituent of the substituted methine group may be substituent W, and it is preferred that all of the $L_1$, $L_2$, and $L_3$ are the unsubstituted methine group.

$L_1$ to $L_3$ may be linked to each other to form a ring, and preferred examples of the formed ring may include a cyclohexene ring, a cyclopentene ring, a benzene ring, a thiophene ring and the like.

n represents an integer of 0 or more, preferably an integer of 0 to 3, and more preferably 0. In the case where n is increased, an absorption wavelength region may be a long wavelength, but a decomposition temperature by heat is decreased. It is preferred that n is 0 in that appropriate absorption is provided in a visible ray region and thermal decomposition is suppressed during film formation by deposition.

$D_1$ represents an atom group. It is preferred that $D_1$ is a group including —$NR^a(R^b)$, and it is more preferred that $D_1$ represents an arylene group in which —$NR^a(R^b)$ is substituted. Each of $R^a$ and $R^b$ independently represents a hydrogen atom or a substituent.

The arylene group represented by $D_1$ is preferably an arylene group having 6 to 30 carbon atoms, and more preferably an arylene group having 6 to 18 carbon atoms. The arylene group may have a substituent W as described below, and preferably an arylene group having 6 to 18 carbon atoms, which may have an alkyl group having 1 to 4 carbon atoms. Examples thereof may include a phenylene group, a naphthylene group, an anthracenylene group, a pyrenylene group, a phenanthrenylene group, a methylphenylene group, a dimethylphenylene group and the like, and a phenylene group or a naphthylene group is preferable.

The substituent represented by $R^a$ and $R^b$ may be substituent W as described below, and is preferably an aliphatic hydrocarbon group (preferably an alkyl group, or an alkenyl group, which may be substituted), an aryl group (preferably a phenyl group which may be substituted), or a heterocyclic group.

Each of the aryl group represented by $R^a$ and $R^b$ is independently preferably an aryl group having 6 to 30 carbon atoms and more preferably an aryl group having 6 to 18 carbon atoms. The aryl group may have a substituent, and is preferably an aryl group having 6 to 18 carbon atoms, which may have an alkyl group having 1 to 4 carbon atoms or an aryl group having 6 to 18 carbon atoms. Examples thereof include a phenyl group, a naphthyl group, an anthracenyl group, a pyrenyl group, a phenanthrenyl group, a methylphenyl group, a dimethylphenyl group, a biphenyl group and the like, and a phenyl group or a naphthyl group is preferred.

Each of the heterocyclic group represented by $R^a$ and $R^b$ is independently preferably a heterocyclic group having 3 to 30 carbon atoms and more preferably a heterocyclic group having 3 to 18 carbon atoms. The heterocyclic group may have a substituent, and is preferably a heterocyclic group having 3 to 18 carbon atoms, which may have an alkyl group having 1 to 4 carbon atoms or an aryl group having 6 to 18 carbon atoms. In addition, it is preferred that the heterocyclic group represented by $R^a$ and $R^b$ is a condensed ring structure, a condensed ring structure of combination of rings selected from a furane ring, a thiophene ring, a cellenophene ring, a sylol ring, a pyridine ring, pyrazine ring, a pyrimidine ring, an oxazole ring, a thiazole ring, a triazole ring, an oxadiazole ring, and a thiadiazole ring (the rings may be the same as each other), and a quinoline ring, an isoquinoline ring, a benzothiophene ring, a dibenzothiophene ring, a thienothiophene ring, a bithienobenzene ring, and a bithienothiophene ring.

The arylene group and the aryl group represented by $D_1$, $R^a$ and $R^b$ are preferably a condensed ring structure, and more preferably a condensed ring structure including a benzene ring, and further more preferably a naphthalene ring, an anthracene ring, a pyrene ring, and a phenanthrene ring, and in particular more preferably a naphthalene ring or an anthracene ring.

Examples of substituent W include a halogen atom, an alkyl group (including a cycloalkyl group, a bicycloalkyl group, and a tricycloalkyl group), an alkenyl group (including a cycloalkenyl group, and a bicycloalkenyl group), an alkynyl group, an aryl group, a heterocyclic group (may also be called a hetero ring group), a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyl group, an aryloxycarbonyl group, an amino group (including an anylino group), an ammonio group, an acylamino group, an aminocarbonylamino group, an alkoxycarbonylamino group, an aryloxycarbonylamino group, a sulfamoylamino group, an alkyl and arylsulfonylamino group, a mercapto group, an alkylthio group, an arylthio group, a heterocyclic thio group, a sulfamoyl group, a sulfo group, an alkyl and arylsulfinyl group, an alkyl and arylsulfonyl group, an acyl group, an aryloxycarbonyl group, an alkoxycarbonyl group, a carbamoyl group, an aryl and heterocyclic azo group, an imide group, a phosphino group, a phosphinyl group, a phosphinyloxy group, a phosphinylamino group, a phosphono group, a silyl group, a hydrazino group, a ureide group, a boronic acid group (—$B(OH)_2$), a phosphate group (—$OPO(OH)_2$), a sulfate group (—$OSO_3H$), and other known substituents.

In the case where $R^a$ and $R^b$ represent substituents (preferably an alkyl group or an alkenyl group), the substituents may be bonded to a hydrogen atom or a substituent of an aromatic ring (preferably benzene ring) frame of an aryl group in which —$NR^a(R^b)$ is substituted to form a ring (preferably a 6-membered ring).

The substituents of $R^a$ and $R^b$ may bond to each other to form a ring (preferably a 5-membered or 6-membered ring and more preferably a 6-membered ring), and each of $R^a$ and $R^b$ may be bonded to a substituent in L (representing any one of $L_1$, $L_2$ and $L_3$) to form a ring (preferably a 5-membered or 6-membered ring and more preferably a 6-membered ring).

The compound represented by Formula (1) is a compound disclosed in Japanese Patent Application Laid-Open No. 2000-297068, and a compound that is not disclosed in JP 2000-297068 may be manufactured based on a synthesis method disclosed in JP 2000-297068.

It is preferable that the compound represented by Formula (1) be a compound represented by Formula (2).

[Chem. 2]

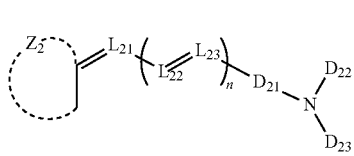

Formula (2)

In the Formula, $Z_2$, $L_{21}$, $L_{22}$, $L_{23}$ and n have the same meaning as $Z_1$, $L_1$, $L_2$, $L_3$ and n of Formula (1), and preferred examples thereof are the same. $D_{21}$ represents a substituted or unsubstituted arylene group. Each of $D_{22}$ and $D_{23}$ independently represents a substituted or unsubstituted aryl group or a substituted or unsubstituted heterocyclic group.

Further, $D_{21}$ and $D_{22}$, $D_{21}$ and $D_{23}$, or $D_{22}$ and $D_{23}$ may be linked to form a condensed ring structure.

The arylene group represented by $D_{21}$ has the same meaning as the arylene ring group represented by $D_1$, and preferred examples thereof are the same.

Each of the aryl group represented by $D_{22}$ and $D_{23}$ independently has the same meaning as the heterocyclic group represented by $R^a$ and $R^b$, and preferred examples thereof are the same.

In the case where $D_{21}$ and $D_{22}$, $D_{21}$ and $D_{23}$, or $D_{22}$ and $D_{23}$ are linked to form the condensed ring structure, examples of a linking group linking $D_{21}$ with $D_{22}$, $D_{21}$ with $D_{23}$, or $D_{22}$ with $D_{23}$ include a single bond, a double bond, an alkylene group, a nitrogen atom and a group formed by combining these groups. Among these examples, an alkylene group (for example, a methylene group, an ethylene group and the like) is preferred. The linking group may have a substituent, and examples of the substituent include groups exemplified in the aforementioned substituent W, and among the examples, an alkyl group and an aryl group are preferred, and an alkyl group is more preferred.

Hereinafter, specific examples of the compound represented by Formula (1) are represented by Formula (3), but the present invention is not limited thereto.

[Chem. 3]

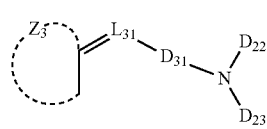

Formula (3)

In Formula 3, a ring formed by $Z_3$ and two carbon atoms represents any one of A-1 to A-15 of the following Table 1. $L_{31}$ represents CH. $D_{31}$ represents any one of B-1 to B-9 of the following Table 1, and each of $D_{32}$ and $D_{33}$ independently represents any one of C-1 to C-20 of the following Table 2. The case where $D_{31}$ and $D_{32}$, $D_{31}$ and $D_{33}$, or $D_{32}$ and $D_{33}$ are linked to form a condensed ring structure is represented by D-1 of the following Table 2.

TABLE 1

In the table, * represents a bonding site in Formula (3).

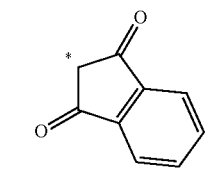

A-1

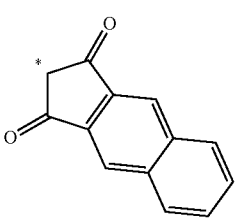 [SMILES: O=C1CC(=O)c2cc3ccccc3cc21]

A-2

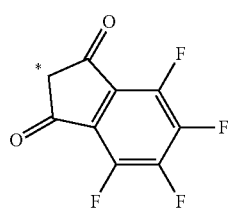 [SMILES: O=C1CC(=O)c2c(F)c(F)c(F)c(F)c21]

A-3

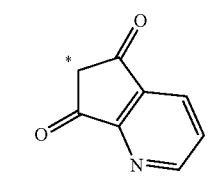 [SMILES: O=C1CC(=O)c2ncccc21]

A-4

TABLE 1-continued

In the table, * represents a bonding site in Formula (3).

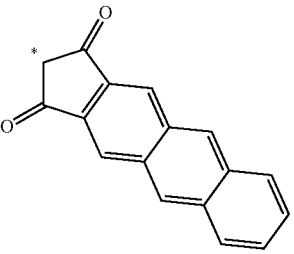 [SMILES: O=C1CC(=O)c2cc3cc4ccccc4cc3cc21]

A-5

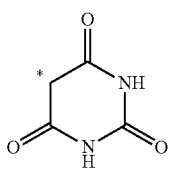

A-6

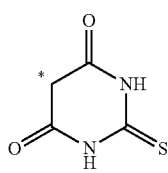

A-7

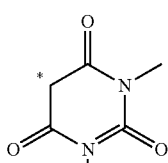

A-8

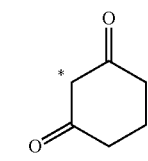

A-9

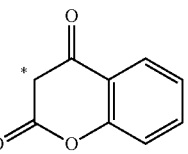

A-10

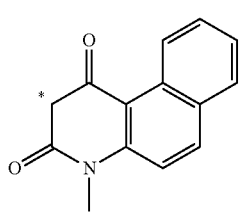 [SMILES: CN1C(=O)CC(=O)c2c1ccc1ccccc21]

A-11

TABLE 1-continued
In the table, * represents a bonding site in Formula (3).
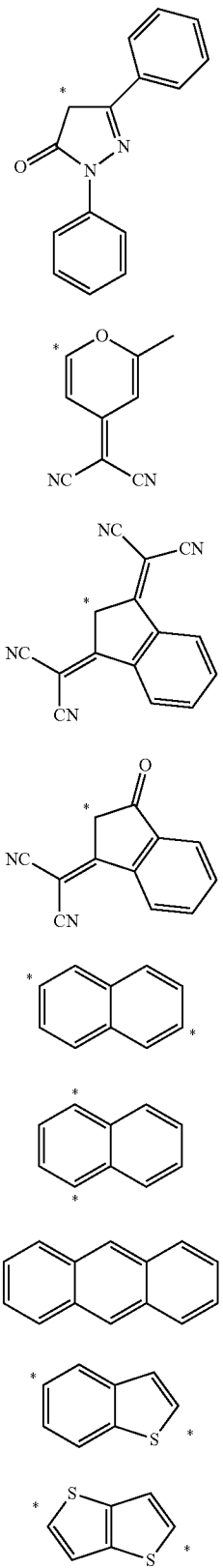
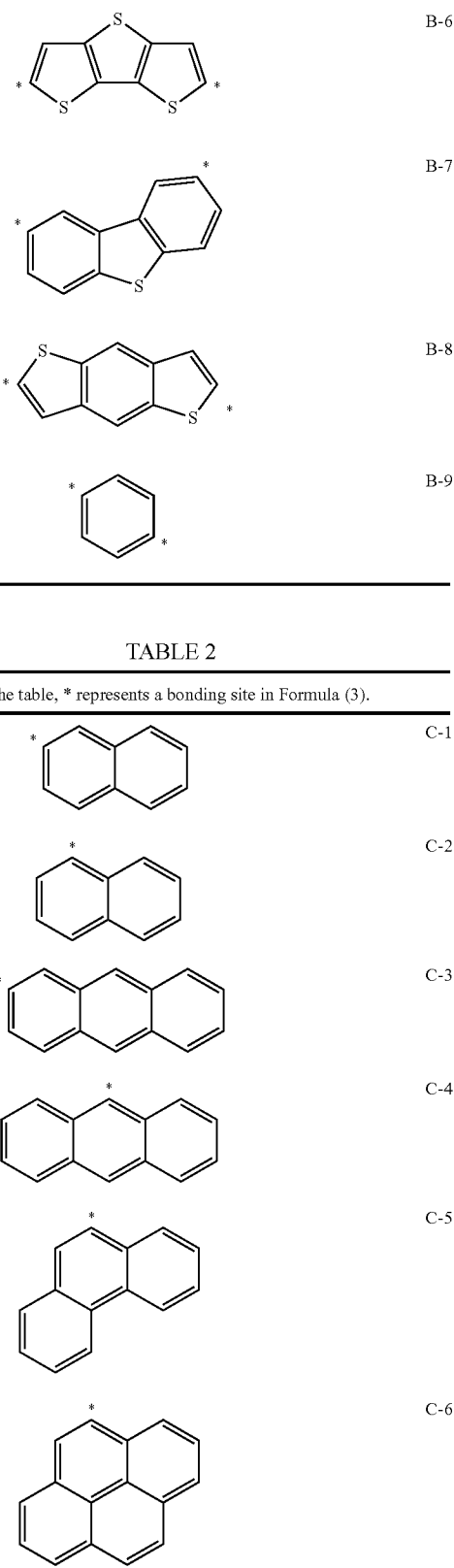

TABLE 2-continued

In the table, * represents a bonding site in Formula (3).

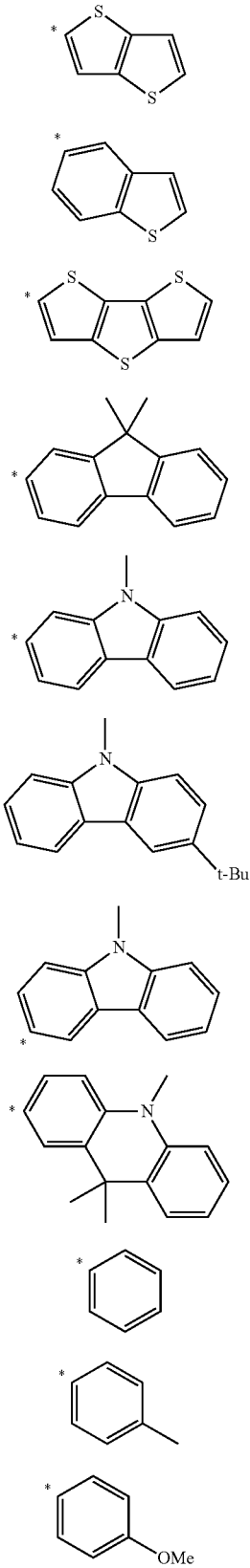
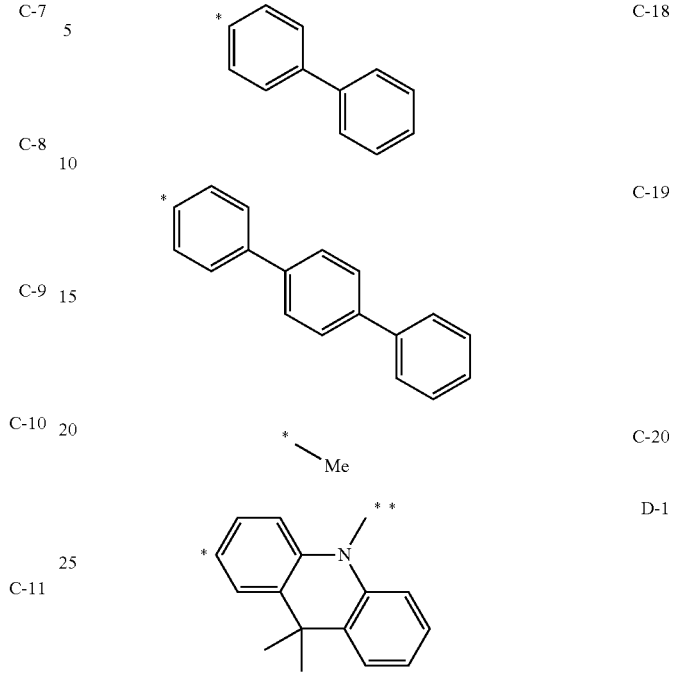

Me represents a methyl group.
In D-1 of Table 2, in the case where $D_{31}$ and $D_{32}$ or $D_{31}$ and $D_{33}$ are linked to form a ring, "**" represents a bonding site to $D_{32}$ or $D_{33}$ (a portion not linked to $D_{31}$), and "*" represents a bonding site to $L_{31}$.
In the case where $D_{32}$ and $D_{33}$ are linked to form a ring, "**" represents a bonding site to $D_{31}$ (in this case, "*" does not represent a bonding site).

$Z_3$ is preferably A-1, A-2, or A-13 to A-15, and more preferably A-2 or A-13 to A-15. $D_{31}$ is preferably B-1 or B-9 and more preferably B-9. Each of $D_{32}$ and $D_{33}$ is independently preferably C-1, C-2 or C-15 to C-20, and more preferably C-15 to C-20. $D_{32}$ and $D_{33}$ may be different from each other, but preferably the same as each other.

The compound represented by Formula (1) is more preferably a compound in which a ring is formed by $Z_3$ and two carbon atoms (hereinafter, simply referred to as "$Z_3$ ring" in Table 3), $L_{31}$, $D_{31}$, $D_{32}$ and $D_{33}$ in Formula (3) are combinations of the following Table 3, but the present invention is not limited thereto. Further, A-1 to A-15, B-1 to B-9, C-1 to C-20 and D-1 of Table 3 have the same meaning as those shown in Tables 1 and 2. Further, in the following compound P-1, $D_{31}$ and $D_{32}$ are linked to form a condensed ring structure.

TABLE 3

| Compound | $Z_3$ ring | $L_{31}$ | $D_{31}$ | $D_{32}$ | $D_{33}$ |
|---|---|---|---|---|---|
| P-1 | A-2 | CH | B-9 | C-15 | C-15 |
| P-2 | A-13 | CH | B-9 | C-20 | C-20 |
| P-3 | A-2 | CH | B-9 | C-16 | C-16 |
| P-4 | A-2 | CH | B-9 | C-18 | C-18 |
| P-5 | A-2 | CH | B-9 | C-17 | C-17 |
| P-6 | A-2 | CH | B-9 | C-19 | C-19 |
| P-7 | A-14 | CH | B-9 | C-15 | C-15 |
| P-8 | A-15 | CH | B-9 | C-15 | C-15 |
| P-9 | A-2 | CH | D-1 (Condensed ring structure) | | C-15 |

Examples of the particularly preferable P-type organic semiconductor include a dye or a material not having five or more condensed ring structures (a material having 0 to 4 condensed ring structures and preferably 1 to 3 condensed ring structures). If a pigment-based P-type material generally used in an organic thin film solar cell is used, a dark current is apt to be easily increased at a pn interface, and a light response is easily delayed by a trap at crystal grain boundaries, such that it is difficult to use the pigment-based P-type material for an imaging device. Accordingly, a dye-based P-type material that is difficult to crystallize or a material not having five or more condensed ring structures may be preferably used for an imaging device.

(N-Type Organic Semiconductor)

The N-type organic semiconductor (compound) is an acceptor-type organic semiconductor (compound) and mainly represented by an electron transporting organic compound, and means an organic compound having a property of easily accepting electrons. More particularly, the N-type organic semiconductor represents an organic compound having large electron affinity when two organic compounds are used in contact with each other. Accordingly, the acceptor-type organic compound may be any organic compound as long as the organic compound is an electron accepting organic compound.

For example, a metal complex having a condensed aromatic carbon ring compound (a naphthalene derivative, an anthracene derivative, a phenanthrene derivative, a tetracene derivative, a pyrene derivative, a perylene derivative, and a fluoranthene derivative), 5-membered to 7-membered heterocyclic compounds containing a nitrogen atom, an oxygen atom, and a sulfur atom (for example, pyridine, pyrazine, pyrimidine, pyridazine, triazine, quinoline, quinoxaline, quinazoline, phtalazine, cinnoline, isoquinoline, pteridine, acridine, phenazine, phenanthroline, tetrazole, pyrazole, imidazole, thiazole, oxazole, indazole, benzimidazole, benzotriazole, benzooxazole, benzothiazole, carbazole, purine, triazolopyridazine, triazolopyrimidine, tetrazaindene, oxadiazole, imidazopyridine, pyrralidine, pyrrolopyridine, thiadiazolopyridine, dibenzazepine, tribenzazepine and the like), a polyarylene compound, a fluorene compound, a cyclopentadiene compound, a silyl compound, or a heterocyclic compound containing nitrogen as a ligand and the like may be used. Further, the acceptor-type organic compound is not limited thereto, and as described above, any organic compound may be used as an acceptor-type organic semiconductor as long as the organic compound has electron affinity that is larger than that of an organic compound used as the donor-type organic compound. Further, two or more kinds of compounds may be used as the N-type organic semiconductor.

(Organic Dye)

Any organic dye may be used as the P-type organic semiconductor or the N-type organic semiconductor, but preferably, the examples thereof include a cyanine dye, a styryl dye, a hemicyanine dye, a merocyanine dye (including zeromethine merocyanine (simple merocyanine)), a trinuclear merocyanine dye, a tetranuclear merocyanine dye, a laudacyanine dye, a complex cyanine dye, a complex merocyanine dye, an allophore dye, an oxonol dye, a hemioxonol dye, a squarylium dye, a croconium dye, an azamethine dye, a coumarin dye, an arylidene dye, an anthraquinone dye, a triphenylmethane dye, an azo dye, an azomethine dye, a spiro compound, a metallocene dye, a fluorenone dye, a fulgide dye, a perylene dye, a perinone dye, a phenazine dye, a phenothiazine dye, a quinone dye, a diphenylmethane dye, a polyene dye, an acridine dye, an acrydinone dye, a diphenylamine dye, a quinacrydone dye, a quinaphthalone dye, a phenoxazine dye, a phthaloperylene dye, a diketopyrrolopyrrole dye, a dioxane dye, a porphyrine dye, a chlorophyll dye, a phthalocyanine dye, a metal complex dye, and a condensed aromatic carbon ring-based dye (a naphthalene derivative, an anthracene derivative, a phenanthrene derivative, a tetracene derivative, a pyrene derivative, a perylene derivative, and a fluoranthene derivative).

(Ionization Potential)

It is described above that the photoelectric conversion layer 15 formed of the organic layer preferably has the bulk hetero structure of the P-type organic semiconductor and the N-type organic semiconductor. However, the present inventors found that if the difference between the ionization potential of the P-type organic semiconductor and the apparent ionization potential of the bulk hetero structure is more than 0.50 eV, sensitivity is deteriorated by the light irradiation, although a detailed internal mechanism thereof is not clear. In consideration of the circumstances, the difference between the ionization potential of the P-type organic semiconductor and the apparent ionization potential of the bulk hetero structure may be at least 0.50 eV or less and preferably 0.40 eV or less. The difference may be more preferably 0.30 eV or less and even more preferably 0.20 eV or less. A lower limit thereof is preferably 0.05 eV or more and more preferably 0.10 eV or more.

The apparent ionization potential of the bulk hetero structure may be controlled by selecting the material of the P-type organic semiconductor and the N-type organic semiconductor, or by changing the content of the P-type organic semiconductor and the N-type organic semiconductor in the photoelectric conversion layer 15.

Further, in the case where the photoelectric conversion device including the bulk hetero structure is formed by deposition, it may also be controlled by changing a deposition condition (atmosphere during deposition, deposition temperature, and deposition rate of each of the P-type organic semiconductor and the N-type organic semiconductor). The atmosphere during deposition is an atmosphere in which gases and the like are introduced, and the degree of vacuum is preferably $4 \times 10^{-4}$ Pa or less and more preferably $1 \times 10^{-5}$ Pa or less. The temperature of the atmosphere during deposition is preferably 10 to 50° C. and more preferably 20 to 40° C. The deposition rate of the P-type organic semiconductor is preferably 0.1 to 10.0 Å/s and more preferably 0.2 to 8.0 Å/s, and the deposition rate of the N-type organic semiconductor is preferably 0.3 to 30.0 Å/s and more preferably 0.6 to 24.0 Å/s.

In addition, the present inventors found that if the apparent ionization potential of the bulk hetero structure of the photoelectric conversion layer 15 formed of the organic layer is more than 5.80 eV, sensitivity is deteriorated by the light irradiation even though a detailed internal mechanism thereof is not clear. In consideration of the above circumstances, the ionization potential of the bulk hetero structure of the photoelectric conversion layer 15 formed of the organic layer is preferably 5.80 eV or less, more preferably 5.70 eV or less, and even more preferably 5.65 eV or less. Further, the ionization potential of the bulk hetero structure of the photoelectric conversion layer 15 is preferably 5.20 eV or more.

(Fullerene)

It is preferred that a fullerene or a fullerene derivative having an excellent electron transporting property is used as the N-type organic semiconductor. More preferably, a fullerene multimer is included.

A fullerene represents fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, mixed fullerene and fullerene nanotubes, and a fullerene derivative represents to a compound where a substituent is added thereto.

The substituent of the fullerene derivative is preferably an alkyl group, an aryl group or a heterocyclic group. The alkyl group is more preferably an alkyl group having 1 to 12 carbon atoms, and the aryl group and the heterocyclic group are preferably a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indol ring, a benzofuran ring, a benzothiophene ring, an isobenzofuran ring, a benzimidazole ring, an imidazopyridine ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring or a phenazine ring, more preferably a benzene ring, a naphthalene ring, an anthracene ring, a phenanthrene ring, a pyridine ring, an imidazole ring, an oxazole ring or a thiazole ring, and particularly preferably a benzene ring, a naphthalene ring or a pyridine ring. These may further have a substituent, and the substituent may be bonded to each other to form a ring, to a maximum extent. Further, it may have a plurality of substituents, and the substituents may be the same as or different from each other. Further, the plurality of substituents may be bonded to each other to form a ring, to a maximum extent.

The fullerene or the fullerene derivative may be formed of the fullerene multimer by the light irradiation.

The photoelectric conversion layer 15 includes fullerene or the fullerene derivative, thereby it becomes possible to rapidly transport electrons generated by photoelectric conversion via the fullerene molecules or the fullerene derivative molecules to the lower electrode 104 or the upper electrode 108. If the fullerene molecules or the fullerene derivative molecules are connected to form a path of electrons, an electron transporting property is improved, thus it becomes possible to implement a high-speed response of the photoelectric conversion device 100. In order to maintain a junction interface of the P-type organic semiconductor and exciton dissociation efficiency with obtaining the above effects, it is preferable that fullerene or the fullerene derivative is included in the photoelectric conversion layer 15 in a volume ratio of 40% or more, more preferably 50% or more.

Further, it is preferred that the fullerene or the fullerene derivative is included in the photoelectric conversion layer 15 in a volume of 85% or less from the viewpoint of maintenance of exciton dissociation efficiency and a junction interface of the P-type organic semiconductor.

In the photoelectric conversion layer 15, it is possible to use a triarylamine compound as the P-type organic semiconductor to be mixed with the fullerene or the fullerene derivative as described in Japanese Patent No. 4213832. In this case, it is more preferable because it is possible to achieve a high SN ratio of the photoelectric conversion device 100.

Further, a structure having a substituent at a para position of an aryl group is particularly preferred with respect to a nitrogen atom of the triarylamine frame. Examples of the substituent include an alkyl group, a cycloalkyl group, an alkylene group, an aryl group, a heterocyclic group, a carbonyl group, an alkoxy group, a cyano group and the like. A methyl group, an ethylene group, a phenyl group, a cyclopentyl group, a pyran group, a carbonyl group, a methoxy group and a cyano group are preferred, and an ethylene group and a phenyl group are more preferred. The substituents may have another substituent. Further, the substituents may be bonded to each other to form a ring, to a maximum extent. Further, the substituent may have a plurality of substituents, and the substituents may be the same as or different from each other. Further, a plurality of substituents may be bonded to each other to form a ring, to a maximum extent. Examples of such a ring include benzene, naphthalene, pyran, cyclopentyldion and a condensed ring thereof.

If the ratio of fullerene or the fullerene derivative in the photoelectric conversion layer is excessively high, the triarylamine compound becomes less, such that an absorption quantity of incident light is reduced. As a result, the photoelectric conversion efficiency is reduced, and accordingly, it is preferred that the fullerene or the fullerene derivative included in the photoelectric conversion layer is a composition of 85% by volume or less, more preferably a composition of 75% by volume or less.

In the present embodiment, the photoelectric conversion device 100 is constituted by stacking, on the substrate 101, the lower electrode 104, the photoelectric conversion layer 15 formed of the organic layer, and the upper electrode 108 including the transparent electrode material, but it is preferably constituted such that light is incident from the side of the upper electrode 108, electrons generated in the photoelectric conversion layer 15 are extracted at the upper electrode 108, and holes are extracted at the lower electrode 104. Accordingly, the electric charge blocking layer 15a between the lower electrode 104 and the photoelectric conversion layer 15 is used as an electron blocking layer. The electron blocking layer must suppress injection of the electrons from the lower electrode 104 into the photoelectric conversion layer 15, and must not inhibit the holes generated in the photoelectric conversion layer 15 from flowing into the lower electrode 104. Further, the ionization potential of the electric charge blocking layer 15a is generally about 5.2 eV, and it is the P-type organic semiconductor that causes a hole transportation. In consideration of the above circumstances, the ionization potential of the P-type organic semiconductor is preferably 5.20 eV or more, more preferably 5.30 eV or more, and even more preferably 5.40 eV or more.

A pigment type and a dye type are present in the P-type organic semiconductor used in the bulk hetero structure of the photoelectric conversion layer formed of the organic layer of the present embodiment. When the P-type organic semiconductor and the N-type organic semiconductor are constituted to have the bulk hetero structure, matching of an energy diagram is necessary. That is, it is preferred that the ionization potential of the P-type organic semiconductor is smaller than the ionization potential of the N-type organic semiconductor, and it is preferred that the electron affinity of the P-type organic semiconductor is smaller than the electron affinity of the N-type organic semiconductor. By satisfying the above requirement, it is possible to prevent the formation of an electron barrier or a hole barrier, thereby enabling to obtain high photoelectric conversion efficiency. In consideration of the above circumstances, the electron affinity of the P-type organic semiconductor is preferably smaller than the electron affinity of fullerene, and a difference between both electron affinities is preferably 0.20 eV or more, more preferably 0.30 eV or more, and particularly preferably 0.40 eV or more.

The photoelectric conversion layer 15 having the constitution where the P-type organic semiconductor and the N-type organic semiconductor are combined exhibits high photoelectric conversion efficiency. Particularly, as described above, the photoelectric conversion layer 15 where the P-type organic semiconductor and the N-type organic semiconductor are made be a junction is preferred because photoelectric conversion efficiency is improved due to an increase in the junction interface. However, the present inventors found that a peak having a fluorescent wavelength derived from the N-type organic semiconductor may be obtained by a strong and weak interaction with the N-type organic semiconductor. The present inventors also found that when the fluorescent peak of the N-type organic semiconductor is obtained, the exciton generated in the N-type organic semiconductor is not separated into electric charges, and sensitivity is deteriorated by the light irradiation in the organic layer including the photoelectric conversion layer from which the fluorescent peak of the N-type organic semiconductor can be obtained. In consideration of the above circumstances, the fluorescent maximum wavelength of the bulk hetero structure of the photoelectric conversion layer 15 formed of the organic layer at 25° C. is preferably 750 nm or more, more preferably 755 nm or more, and even more preferably 760 nm or more.

Further, high fluorescent quantum yield shows that the exciton returns to the ground state while the exciton excited by light is not separated into electric charges. That is, a reduction in electric charge separation efficiency is exhibited. In the present embodiment, the present inventors found that if the fluorescent quantum yield of the bulk hetero structure including fullerene at 25° C. is 1% or more, sensitivity is deteriorated by the light irradiation. In consideration of the above circumstances, the fluorescent quantum yield of the bulk hetero structure including fullerene at 25° C. is preferably 1.0% or less and more preferably 0.1% or less.

[Electric Charge Blocking Layer]

An electron donating organic material may be used in the electric charge blocking layer. Specifically, an aromatic diamine compound such as N,N'-bis(3-methylphenyl)-1,1'-biphenyl)-4,4'-diamine (TPD) or 4,4'-bis[N-(naphthyl)-N-phenyl-amino]biphenyl (α-NPD), oxazole, oxadiazole, triazole, imidazole, imidazolone, a stilbene derivative, a pyrazoline derivative, tetrahydroimidazole, polyarylalkane, butadiene, 4,4',4"-tris(N-(3-methylphenyl)N-phenylamino)triphenylamine(m-MTDATA), porphine, a porphyrin compound such as tetraphenylporphine copper, phthalocyanine, copper phthalocyanine, and titanium phthalocyanineoxide, a triazole derivative, an oxadiazole derivative, an imidazole derivative, a polyarylalkane derivative, a pyrazoline derivative, a pyrazolone derivative, a phenylenediamine derivative, an anileamine derivative, an amino substituted calcone derivative, an oxazole derivative, a styrylanthracene derivative, a fluorenone derivative, a hydrazone derivative, and a silazane derivative may be used as a low molecular material, and a polymer such as phenylenevinylene, fluorene, carbazole, indole, pyrene, pyrrole, picholine, thiophene, acetylene, and diacetylene or a derivative thereof may be used as a polymer material. Any compound having a sufficient hole transporting property may be used even though the compound is not an electron donating compound.

An inorganic material may be used as the electric charge blocking layer 15a. In general, the dielectric constant of an inorganic material is larger than that of an organic material, and therefore, when the inorganic material is used for the electric charge blocking layer 15a, a large quantity of voltage is applied to the photoelectric conversion layer 15, thereby enabling to increase the photoelectric conversion efficiency. Examples of the material that may form the electric charge blocking layer 15a include calcium oxide, chromium oxide, chromiumcopper oxide, manganese oxide, cobalt oxide, nickel oxide, copper oxide, galliumcopper oxide, strontiumcopper oxide, niobium oxide, molybdenum oxide, indiumcopper oxide, indiumsilver oxide, iridium oxide and the like. More preferably, cerium oxide, tin oxide and the like can be exemplified.

The electric charge blocking layer 15a may be constituted with a plurality of layers. In this case, it is preferable that, among a plurality of layers, a layer adjacent to the photoelectric conversion layer 15 is a layer made of the same material as that of the P-type organic semiconductor included in the photoelectric conversion layer 15. By using the same P-type organic semiconductor in the electric charge blocking layer 15a, the formation of mid-level in the interface of the layer adjacent to the photoelectric conversion layer 15 may be suppressed, and thus, a dark current may be further suppressed.

In the case where the electric charge blocking layer 15a is a single layer, the layer may be formed of an inorganic material, and in the case where the electron blocking layer is formed of a plurality of layers, one or two or more layers may be formed of an inorganic material.

[Upper Electrode]

It is preferred that the upper electrode 108 is constituted with a transparent conductive film as a material thereof in order to allow light to be incident on the organic layer including the photoelectric conversion layer 15. Examples of the material include metal, metal oxides, metal nitrides, metal sulfides, an organic conductive compound, a mixture thereof and the like. Specific examples thereof include conductive metal oxides such as tin oxide, zinc oxide, indium oxide, indium tin oxide (ITO), indium zinc oxide (IZO), indium tungsten oxide (IWO), and titanium oxide, metal nitrides such as titanium nitride (TiN), metal such as gold (Au), platinum (Pt), silver (Ag); chromium (Cr), nickel (Ni), aluminum (Al), mixtures or laminates of the metals and the conductive metal oxides, organic conductive compounds such as polyaniline, polythiophene, and polypyrrole, laminates of the organic conductive compounds and ITO and the like. Preferable examples of the material of the transparent conductive film include any one material of ITO, IZO, tin oxides, antimony-doped tin oxides (ATO), fluorine-doped tin oxides (FTO), zinc oxides, antimony-doped zinc oxides (AZO) and gallium-doped zinc oxides (GZO) which are transparent conductive oxides. More preferable material is ITO.

Further, it is preferred that the film is thick in order to manufacture the film having a low resistance. It is preferred to use a sputtering method as a film formation method of the upper electrode, and a film formation time is increased if the film is formed to be thick, thus increasing damage to the organic layer disposed directly under the upper electrode 108. Therefore, in consideration of the damage to the organic layer, the thickness of the film is preferably 5 to 100 nm and more preferably 3 to 50 nm.

When a reading circuit is a CMOS type, surface resistance of the upper electrode is preferably 10 kΩ/□ or less, and more preferably 1 kΩ/□ or less. When the reading circuit is a CCD type, surface resistance is preferably 1 kΩ/□ or less, and more preferably 0.1 kΩ/□ or less.

Therefore, deterioration of sensitivity by the light irradiation is suppressed, making it possible to provide the photoelectric conversion device having high light resistance. Likewise, the imaging device having the photoelectric conversion device may have high light resistance, and it is possible to obtain image data of a subject having high sensitivity and a high SN ratio.

Figure 2:
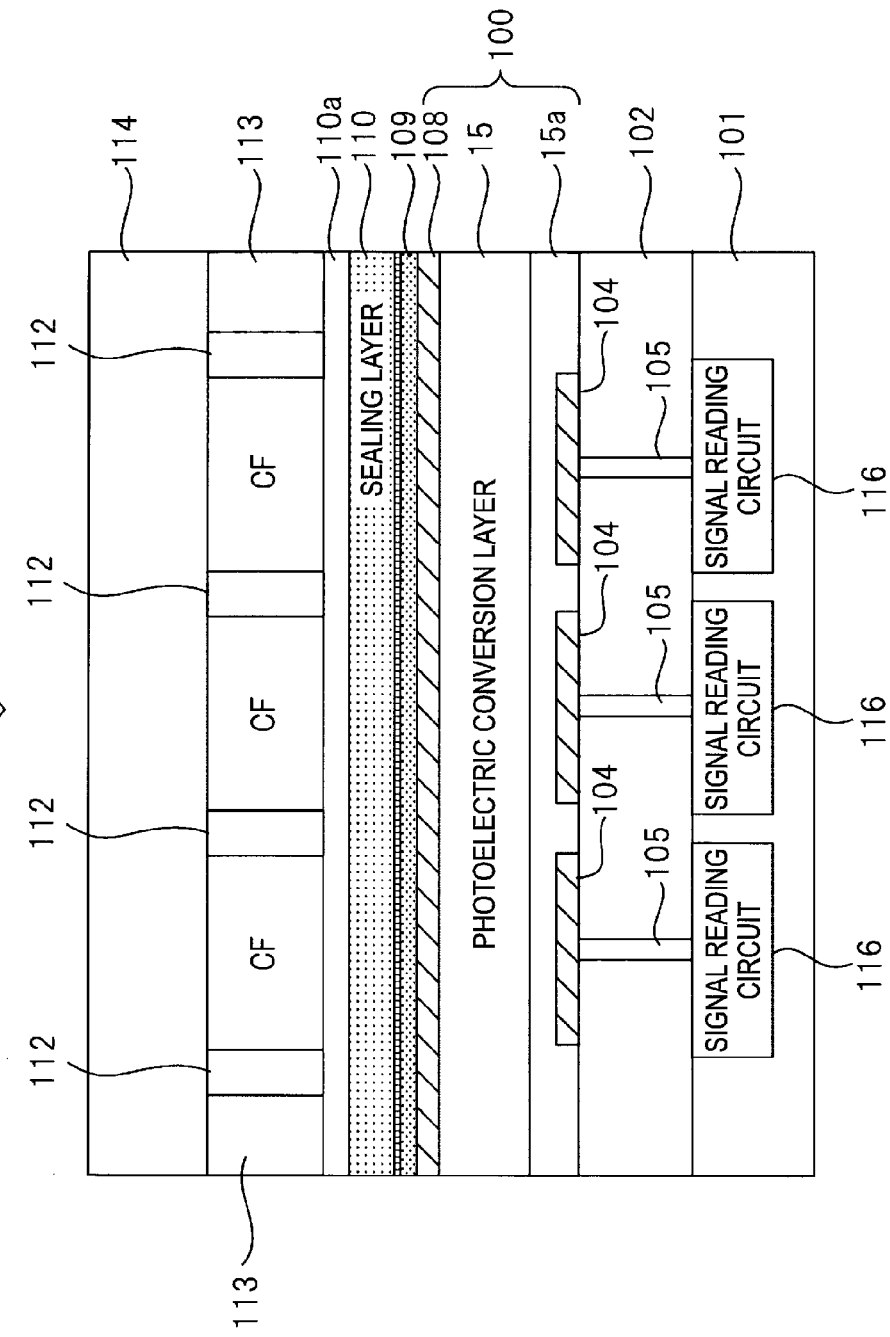
FIG. 2 is a cross-sectional view schematically illustrating an imaging device according to a second embodiment of the present invention.

FIG. 2 is a cross-sectional view schematically illustrating a constitution example of the imaging device having the photoelectric conversion device 100. Members and the like having the same constitution or function as the members and the like described in FIG. 1 are designated by the same or equivalent reference numerals in the drawings to simplify or omit the description thereof.

The imaging device of the present embodiment has a plurality of pixel portions. The plurality of pixel portions are two-dimensionally arranged (not shown) when the substrate 101 including single crystal silicon having a dielectric film is viewed from an incident side of light in a plane. Each of the pixel portions includes at least a lower electrode 104 made of titanium nitride, an organic layer including a photoelectric conversion layer 15 and an electric charge blocking layer 15a, a counter electrode 108 facing the lower electrode 104, a sealing layer 110, a color filter (CF), a partition wall 112 partitioning each color filter, and a signal reading circuit 116.

In the imaging device of this constitution example, the pixel electrodes (lower electrode 104) of the adjacent pixel portions and a plurality of pixel electrodes (lower electrode 104) that are spaced apart from each other by a required minute gap are two-dimensionally arranged on the surface of the dielectric layer 102. In addition, an electric charge blocking layer 15a having a single layer configuration common in each of the pixel portions is formed so as to cover the dielectric layer 102 and each lower electrode 104. The electric charge blocking layer 15a has a function of suppressing injection of electrons from the lower electrode 104 into the photoelectric conversion layer 15. In this constitution example, an electric potential of the counter electrode (upper electrode) 108 may be configured to be higher than that of the signal reading circuit 116 to allow a current to flow from the counter electrode 108 to the lower electrode 104 (that is, to collect holes in the lower electrode 104).

The signal reading circuit 116 is installed on the semiconductor substrate 101, and includes an electric charge accumulation portion accumulating electric charges generated in the photoelectric conversion layer 15 and transferred through a connection portion 105, and a circuit reading a signal in proportion to the electric charge accumulated in the electric charge accumulation portion. For example, the signal reading circuit 116 may be configured to include a floating diffusion (FD), a reset transistor, an output transistor, a selection transistor and a protection transistor limiting an electric potential of the FD, which are constituted by an nMOS transistor. The signal reading circuit 116, a wire layer including a via plug (connection portion) 105, and the dielectric layer 102 and the lower electrode 104 in the drawings are manufactured by a standard CMOS image sensor processor.

The lower electrode 104 may be formed of, for example, titanium nitride (for example, film thickness of 30 nm and surface roughness Ra of 0.4) by a CVD method. Further, an isotropic plasma etching condition may be used in a dry etching process of titanium nitride to perform patterning so that an inclination angle of an end of the lower electrode 104 is, for example, 50°, to the surface of the substrate. Further, herein, the inclination angle of the end is 50° to the surface of the substrate, but the patterning does not need to be performed so that the angle is essentially 50°.

The electric charge blocking layer 15a may be formed, for example, by depositing the following compound 1 in a film thickness of 100 nm. Further, the photoelectric conversion layer 15 (for example, film thickness of 400 nm) having a single layer configuration common in each of the pixel portions may be formed by co-depositing the following Compounds 2 to 4.

[Chem. 4]

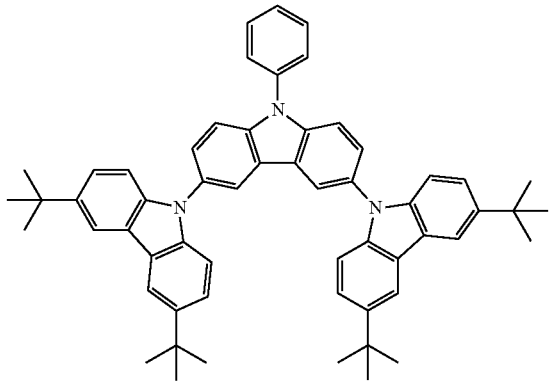

Compound 1

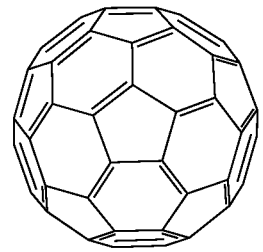

Compound 2

(N type)

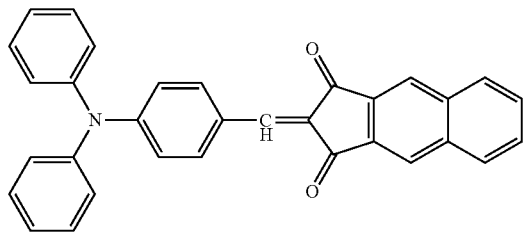

Compound 3

(P type)

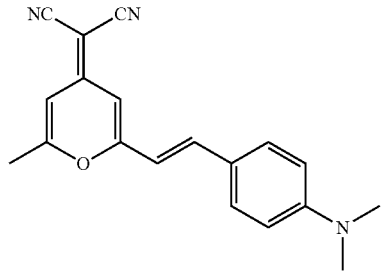

Compound 4

(P type)

Herein, in the case where the electric charge blocking layer 15a has a single layer structure, a difference between electron affinity Ea of the N-type organic semiconductor included in the photoelectric conversion layer 15 and ionization potential Ip of the charge blocking layer 15a adjacent to the photoelectric conversion layer 15 is set to Δ1. Further, a difference between electron affinity Ea of the electric charge blocking layer 15a and a work function of the counter electrode 108 adjacent to the electric charge blocking layer 15a is set to Δ2.

In the case where the electric charge blocking layer 15a is formed of Compound 1 and the photoelectric conversion layer 15 is formed of Compounds 2 to 4, electron affinity Ea of fullerene $C_{60}$ (Compound 2: N-type organic semiconductor) included in the photoelectric conversion layer 15 is 4.2 eV and ionization potential Ip of Compound 1 constituting the electric charge blocking layer 15a is 5.2 eV, and accordingly, $\Delta 1$ is 1.0 eV, such that the photoelectric conversion device 100 having the present constitution may effectively suppress a dark current. Further, since electron affinity Ea of Compound 1 constituting the electric charge blocking layer 15a is 1.9 eV and the work function of titanium nitride constituting the lower electrode 104 is 4.6 eV, $\Delta 2$ is 2.7 eV, such that the photoelectric conversion device 100 having the present constitution may suppress injection of electrons from the lower electrode 104 into the photoelectric conversion layer 15. Further, in the deposition process of the layers, the degree of vacuum is $1 \times 10^{-4}$ Pa or less, and the electric charge blocking layer 15a and the photoelectric conversion layer 15 may be formed by disposing a first metal mask on an upper side of the substrate. In this constitution example, the electric potential of the counter electrode 108 is increased to allow a current to flow from the counter electrode 108 to the lower electrode 104 (that is, to collect holes in the lower electrode 104).

The counter electrode 108 may be formed of ITO having a film thickness of 10 nm by a high frequency magnetron sputter using an ITO target in an atmosphere in which, for example, Ar gas and $O_2$ gas are introduced. A second metal mask is disposed on an upper side of the substrate to form the counter electrode 108. The counter electrode 108 is constituted by a single layer common in each of the pixel portions.

A buffer layer 109, a sealing layer 110 and a sealing auxiliary layer 110a constituted of a single layer which is also common in each of the pixel portions are stacked on the counter electrode 108. The buffer layer 109 may be formed by, for example, vacuum-depositing silicon monoxide in a film thickness of 100 nm. In this deposition process, a third metal mask may be disposed on the upper side of the substrate with, for example, the degree of vacuum of $1 \times 10^{-4}$ Pa or less to form the buffer layer 109 on the counter electrode 108. The buffer layer 109 prevents deterioration factors from reaching the organic photoelectric conversion material disposed underneath it by adsorbing and/or reacting with the factors deteriorating the organic photoelectric conversion material, such as water molecules that permeate through minute defects of the sealing layer 110, which are caused by dust emissions during a manufacturing process and difficult to prevent completely.

An organic EL manufacturing device where a vacuum deposition device forming the electric charge blocking layer 15a, the photoelectric conversion layer 15, the counter electrode 108 and the buffer layer 109, and a sputter device forming the counter electrode 108 are each directly connected to a cluster-type vacuum conveying system (for example, the degree of vacuum of $1 \times 10^{-4}$ Pa or less) may be used as the organic EL manufacturing device of the present embodiment.

For example, the sealing layer 110 may be formed of aluminum oxide having a thickness of 0.2 µm at a substrate temperature of 150° C. or less, in an atmosphere where Ar is used as a carrier gas, and by using trimethylaluminum and water in an atomic layer deposition device.

Further, for example, the sealing auxiliary layer 110a formed of silicon nitride may be formed in a thickness of 0.1 µm on the sealing layer 110. The sealing auxiliary layer 110a protects the sealing layer. For example, the sealing auxiliary layer 110a may be formed by a high frequency magnetron sputter using a silicon nitride target, for example, in an atmosphere in which Ar gas and $N_2$ gas are introduced.

A layer including a color filter (CF), a partition wall 112 and a light-shielding layer 113 is formed on the sealing auxiliary layer 110a, and an over-coating layer 114 is formed thereon.

The partition wall 112 has a function of separating the color filters (CF) and efficiently focusing incident light on the photoelectric conversion layer 15. The light-shielding layer 113 has a function of shielding, from incident light, a peripheral region other than an effective pixel region where the lower electrode 104 is arranged when the substrate 101 is viewed from a plane. The color filters (CFs) are, for example, in Bayer array.

According to the imaging device of this constitution example, deterioration of sensitivity caused by the light irradiation is suppressed, and accordingly, it is possible to provide an imaging device having high light resistance.

Example

Hereinafter, Examples of the present invention will be described. The used compounds were the following Compounds 5 to 11 in addition to the aforementioned Compounds 1 to 4.

[Chem. 5]

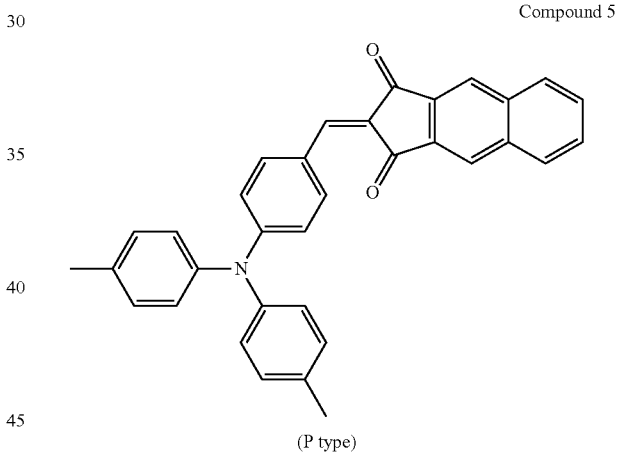

Compound 5

(P type)

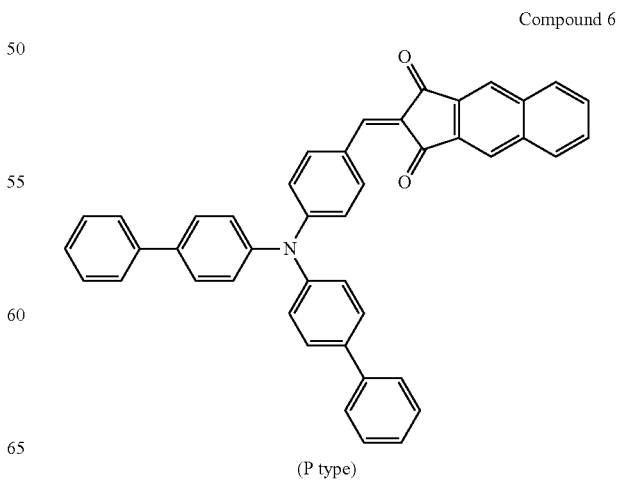

Compound 6

(P type)

Compound 7

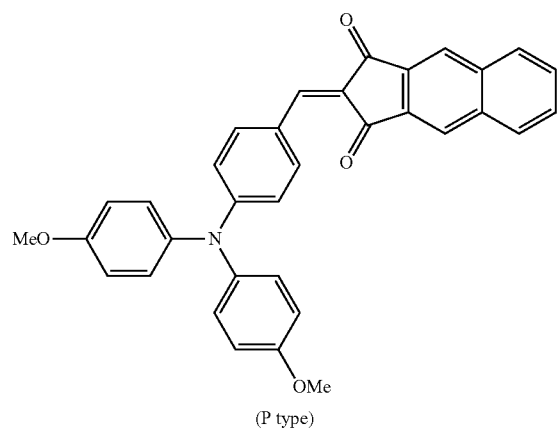

(P type)

Compound 8

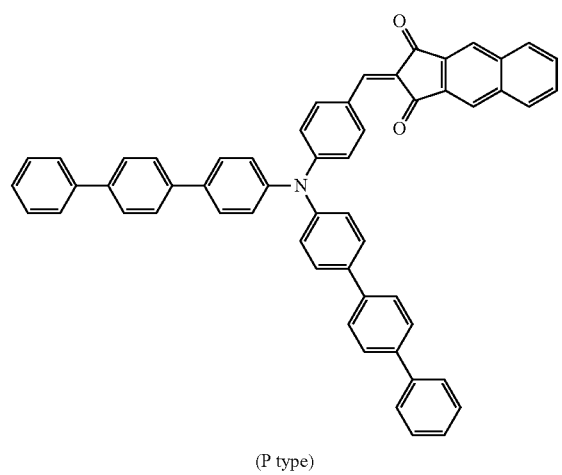

(P type)

Compound 9

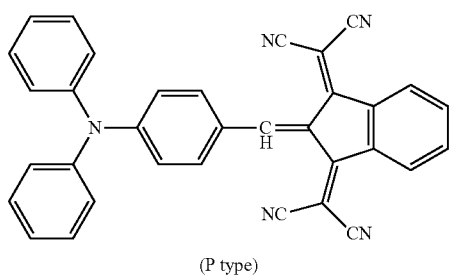

(P type)

Compound 10

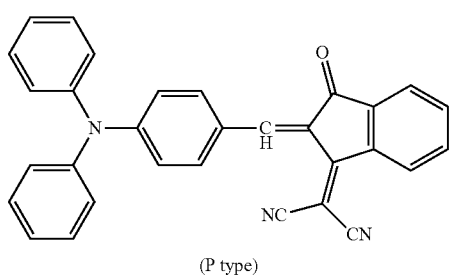

(P type)

Compound 11

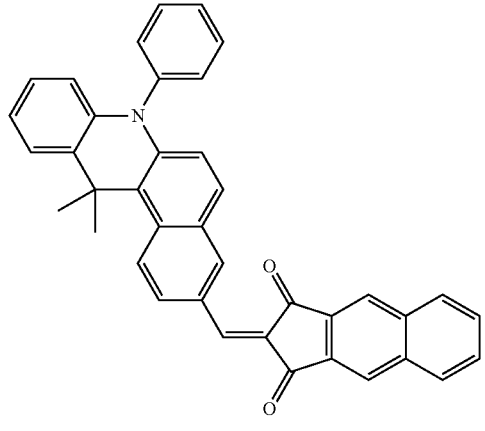

(P type)

The photoelectric conversion devices having the following constitutions were manufactured.

Example 1

Si substrate/TiN(15)/Compound 1(100)/Compounds 2, 4 and 5(400)/ITO(10)

Example 2

Si substrate/TiN(15)/Compound 1(100)/Compounds 2, 3 and 4(400)/ITO(10)

Example 3

Si substrate/TiN(15)/Compound 1(100)/Compounds 2, 3 and 4(400)/ITO(10)

Example 4

Si substrate/TiN(15)/Compound 1(100)/Compounds 2, 4 and 6(400)/ITO(10)

Example 5

Si substrate/TiN(15)/Compound 1(100)/Compounds 2, 4 and 7(400)/ITO(10)

Example 6

Si substrate/TiN(15)/Compound 1(100)/Compounds 2, 4 and 8(400)/ITO(10)

Example 7

Si substrate/TiN(15)/Compound 1(100)/Compounds 2, 4 and 8(400)/ITO(10)

Example 8

Si substrate/TiN(15)/Compound 1(100)/Compounds 2, 4 and 5(400)/ITO(10)

Example 9

Si substrate/TiN(15)/compound 1(100)/Compounds 2 and 6(400)/ITO(10)

Example 10

Si substrate/TiN(15)/compound 1(100)/Compounds 2 and 6(400)/ITO(10)

Example 11

Si substrate/TiN(15)/compound 1(100)/Compounds 2, 4 and 10(400)/ITO(10)

Comparative Example 1

Si substrate/TiN(15)/compound 1(100)/Compounds 2, 3 and 4(400)/ITO(10)

Comparative Example 2

Si substrate/TiN(15)/compound 1(100)/Compounds 2, 3 and 4(400)/ITO(10)

Comparative Example 3

Si substrate/TiN(15)/compound 1(100)/Compounds 2, 3 and 4(400)/ITO(10)

Comparative Example 4

Si substrate/TiN(15)/compound 1(100)/Compounds 2 and 3(400)/ITO(10)

Example 12

Si substrate/TiN(15)/compound 1(100)/Compounds 2, 4 and 9(400)/ITO(10)

Example 13

Si substrate/TiN(15)/compound 1(100)/Compounds 2, 3 and 4(400)/ITO(10)

Example 14

Si substrate/TiN(15)/compound 1(100)/Compounds 2, 4 and 11(400)/ITO(10)

The Examples and the Comparative Examples respectively showed the materials stacked on the silicon substrate and the thickness (unit: nm). Titanium nitride (TiN) was formed as the lower electrode by a CVD method on the single crystal silicon substrate (Si substrate) having silicon oxide in a thickness of 200 nm as a dielectric film, and the electric charge blocking layer formed of Compound 1 was formed thereon by a resistance heating deposition method. The photoelectric conversion layer formed of two or three kinds of compounds was formed thereon by co-deposition or ternary deposition according to the resistance heating deposition method, and the upper electrode of ITO was formed thereon by the sputtering method to manufacture photoelectric conversion devices (Examples 1 to 14 and Comparative Examples 1 to 4).

Herein, the film thickness of the electric charge blocking layer was 100 nm. Further, the compositional ratios of two or three kinds of compounds in the photoelectric conversion layer was set to be compositional ratios (vol %) of the following Table 4, and co-deposition or ternary deposition was performed to have a film thickness of 400 nm.

With respect to the photoelectric conversion device manufactured as described above, IPCE before light irradiation was measured to calculate photoelectric conversion efficiency in the case where the external electric field of $2.0 \times 10^5$ V/cm was applied to the device, and calculate relative sensitivity when the highest value of photoelectric conversion efficiency was 100%. Further, light equivalent to the irradiation time of 300 hours was irradiated in a light quantity of 1000 LUX, and in the case where the external electric field of $2.0 \times 10^5$ V/cm was applied to the device, IPCE before and after the light irradiation was measured by using the quantum efficiency measuring device before and after the light irradiation, thereby calculating a sensitivity deterioration rate. The measurement of the ionization potential, the fluorescent maximum wavelength and the fluorescent quantum yield was respectively performed by a photoelectron spectroscopy in the atmosphere (AC-2) manufactured by Rikenkeiki, Co., Ltd. and a fluorescence measuring method (SPEXFluorolog-3) manufactured by HORIBA Jobin Yvon, Co., Ltd., using the photoelectric conversion device before the light irradiation, while the excitation wavelength was set to 500 nm, the photomal detector was used in a visible region, and the cooling-type InGaAs detector was used in a near-infrared region. Further, the band gap was defined from the absorption edge wavelength of the absorption spectrum to calculate the differential value of the band gaps as the electron affinity based on the ionization potential.

Further, Compound 2 (fullerene $C_{60}$) forms a multimer by the light irradiation.

The measurement results are shown in Table 4. In the Table, Ip represents the ionization potential, and Ea represents the electron affinity. Further, in the case where two or more kinds of P-type organic semiconductors are used, the ionization potential of the P-type organic semiconductor shown in Table 4 represents the ionization potential of co-deposition film or ternary deposition of the two or more kinds of P-type organic semiconductors, and is measured at room temperature by the photoelectron spectroscopy in the atmosphere (AC-2).

TABLE 4

| Sample | Compound of the photoelectric conversion layer (vol %) | Ip 1 of the P-type organic semiconductor (eV) | Ip 2 of the bulk hetero structure (eV) | Ip 2 − Ip 1 (eV) | Fluorescent maximum wavelength of the bulk hetero structure (25° C.) (nm) | Fluorescent quantum yield of the bulk hetero structure (%) | Sensitivity deterioration ratio (%) | Relative sensitivity (%) | Ea2 of the P-type organic semiconductor (eV) | Ea1 of fullerene (eV) | Ea1 − Ea2 |
|---|---|---|---|---|---|---|---|---|---|---|---|
| Example 1 | 2, 4, 5 (75:2:23) | 5.52 | 5.65 | 0.13 | 840 | 0.05 | 0 | 100 | 3.32 | 4.2 | 0.88 |
| Example 2 | 2, 3, 4 (67:31:2) | 5.52 | 5.8 | 0.28 | 750 | 0.8 | 0 | 85 | 3.4 | 4.2 | 0.8 |

TABLE 4-continued

| Sample | Compound of the photo-electric conversion layer (vol %) | Ip 1 of the P-type organic semi-conductor (eV) | Ip 2 of the bulk hetero structure (eV) | Ip 2 − Ip 1 (eV) | Fluorescent maximum wavelength of the bulk hetero structure (25° C.) (nm) | Fluorescent quantum yield of the bulk hetero structure (%) | Sensitivity deterioration ratio (%) | Relative sensitivity (%) | Ea2 of the P-type organic semi-conductor (eV) | Ea1 of fullerene (eV) | Ea1 − Ea2 |
|---|---|---|---|---|---|---|---|---|---|---|---|
| Example 3 | 2, 3, 4 (50:48:2) | 5.52 | 5.7 | 0.18 | 760 | 0.1 | 0 | 100 | 3.4 | 4.2 | 0.8 |
| Example 4 | 2, 4, 6 (75:2:23) | 5.58 | 5.78 | 0.2 | 760 | 0.2 | 0 | 90 | 3.47 | 4.2 | 0.73 |
| Example 5 | 2, 4, 7 (75:2:23) | 5.45 | 5.75 | 0.3 | 780 | 0.5 | 0 | 83 | 3.4 | 4.2 | 0.8 |
| Example 6 | 2, 4, 8 (75:2:23) | 5.2 | 5.6 | 0.4 | 750 | 0.8 | 0 | 85 | 3.4 | 4.2 | 0.8 |
| Example 7 | 2, 4, 8 (50:2:48) | 5.2 | 5.2 | 0 | 750 | 0.8 | 0 | 70 | 3.4 | 4.2 | 0.8 |
| Example 8 | 2, 4, 5 (83:2:15) | 5.52 | 5.7 | 0.18 | 840 | 0.05 | 0 | 100 | 3.32 | 4.2 | 0.88 |
| Example 9 | 2, 6 (75:25) | 5.43 | 5.55 | 0.12 | 840 | 0.05 | 0 | 100 | 3.47 | 4.2 | 0.73 |
| Example 10 | 2, 6 (67:33) | 5.43 | 5.46 | 0.03 | 840 | 0.05 | 0 | 100 | 3.47 | 4.2 | 0.73 |
| Example 11 | 2, 4, 10 (75:2:23) | 5.62 | 5.65 | 0.03 | 840 | 0.05 | 0 | 100 | 3.9 | 4.2 | 0.3 |
| Comparative Example 1 | 2, 3, 4 (88:10:2) | 5.52 | 6.08 | 0.56 | 740 | 3 | 30 | 70 | 3.4 | 4.2 | 0.8 |
| Comparative Example 2 | 2, 3, 4 (83:15:2) | 5.52 | 6.06 | 0.54 | 745 | 2 | 25 | 75 | 3.4 | 4.2 | 0.8 |
| Comparative Example 3 | 2, 3, 4 (75:23:2) | 5.52 | 6.03 | 0.51 | 748 | 1.5 | 10 | 80 | 3.4 | 4.2 | 0.8 |
| Comparative Example 4 | 2, 3 (75:25) | 5.52 | 6.1 | 0.58 | 748 | 1.5 | 10 | 80 | 3.4 | 4.2 | 0.8 |
| Example 12 | 2, 4, 9 (75:2:23) | 5.65 | 5.7 | 0.05 | 800 | 0.1 | 30 | 100 | 4.05 | 4.2 | 0.2 |
| Example 13 | 2, 3, 4 (45:53:2) | 5.52 | 5.7 | 0.18 | 765 | 3 | 0 | 50 | 3.4 | 4.2 | 0.8 |
| Example 14 | 2, 4, 11 (75:2:23) | 5.52 | 5.6 | 0.08 | 840 | 0.05 | 0 | 100 | 3.32 | 4.2 | 0.88 |

From the results shown in Table 4, the following can be seen. Hereinafter, comparisons of Examples and Comparative Examples will be described based on extracted Tables.

TABLE 5

| Sample | Compound of the photo-electric conversion layer (vol %) | Ip 1 of the P-type organic semi-conductor (eV) | Ip 2 of the bulk hetero structure (eV) | Ip 2 − Ip 1 (eV) | Fluorescent maximum wavelength of the bulk hetero structure (25° C.) (nm) | Fluorescent quantum yield of the bulk hetero structure (%) | Sensitivity deterioration ratio (%) | Relative sensitivity (%) | Ea2 of the P-type organic semi-conductor (eV) | Ea1 of fullerene (eV) | Ea1 − Ea2 |
|---|---|---|---|---|---|---|---|---|---|---|---|
| Comparative Example 3 | 2, 3, 4 (75:23:2) | 5.52 | 6.03 | 0.51 | 748 | 1.5 | 10 | 80 | 3.4 | 4.2 | 0.8 |
| Example 6 | 2, 4, 8 (75:2:23) | 5.2 | 5.6 | 0.4 | 750 | 0.8 | 0 | 85 | 3.4 | 4.2 | 0.8 |
| Example 1 | 2, 4, 5 (75:2:23) | 5.52 | 5.65 | 0.13 | 840 | 0.05 | 0 | 100 | 3.32 | 4.2 | 0.88 |

As shown in Table 5, when comparing Examples 1 and 6 and Comparative Example 3 having the same volume ratio of the N-type organic semiconductor and the P-type organic semiconductor, it can be seen that the difference between the ionization potential of the P-type organic semiconductor and the apparent ionization potential of the bulk hetero structure can be prevented from being 0.5 eV or more by changing the kind of the P-type organic semiconductor and a combination thereof. Further, it can be seen that the fluorescent maximum wavelength becomes 750 nm or more by preventing the apparent ionization potential of the bulk hetero structure of the photoelectric conversion layer from being 5.80 eV or more, and thus, there is no deterioration of sensitivity before and after the light irradiation.

TABLE 6

| Sample | Compound of the photoelectric conversion layer (vol %) | Ip 1 of the P-type organic semiconductor (eV) | Ip 2 of the bulk hetero structure (eV) | Ip 2 − Ip 1 (eV) | Fluorescent maximum wavelength of the bulk hetero structure (25° C.) (nm) | Fluorescent quantum yield of the bulk hetero structure (%) | Sensitivity deterioration ratio (%) | Relative sensitivity (%) | Ea2 of the P-type organic semiconductor (eV) | Ea1 of fullerene (eV) | Ea1 − Ea2 |
|---|---|---|---|---|---|---|---|---|---|---|---|
| Comparative Example 1 | 2, 3, 4 (88:10:2) | 5.52 | 6.08 | 0.56 | 740 | 3 | 30 | 70 | 3.4 | 4.2 | 0.8 |
| Comparative Example 2 | 2, 3, 4 (83:15:2) | 5.52 | 6.06 | 0.54 | 745 | 2 | 25 | 75 | 3.4 | 4.2 | 0.8 |
| Comparative Example 3 | 2, 3, 4 (75:23:2) | 5.52 | 6.03 | 0.51 | 748 | 1.5 | 10 | 80 | 3.4 | 4.2 | 0.8 |
| Example 2 | 2, 3, 4 (67:31:2) | 5.52 | 5.8 | 0.28 | 750 | 0.8 | 0 | 85 | 3.4 | 4.2 | 0.8 |
| Example 3 | 2, 3, 4 (50:48:2) | 5.52 | 5.7 | 0.18 | 760 | 0.1 | 0 | 100 | 3.4 | 4.2 | 0.8 |
| Example 13 | 2, 3, 4 (45:53:2) | 5.52 | 5.7 | 0.18 | 765 | 3 | 0 | 50 | 3.4 | 4.2 | 0.8 |

TABLE 7

| Sample | Compound of the photoelectric conversion layer (vol %) | Ip 1 of the P-type organic semiconductor (eV) | Ip 2 of the bulk hetero structure (eV) | Ip 2 − Ip 1 (eV) | Fluorescent maximum wavelength of the bulk hetero structure (25° C.) (nm) | Fluorescent quantum yield of the bulk hetero structure (%) | Sensitivity deterioration ratio (%) | Relative sensitivity (%) | Ea2 of the P-type organic semiconductor (eV) | Ea1 of fullerene (eV) | Ea1 − Ea2 |
|---|---|---|---|---|---|---|---|---|---|---|---|
| Comparative Example 4 | 2, 3 (75:25) | 5.52 | 6.1 | 0.58 | 748 | 1.5 | 10 | 80 | 3.4 | 4.2 | 0.8 |
| Example 9 | 2, 6 (75:25) | 5.43 | 5.55 | 0.12 | 840 | 0.05 | 0 | 100 | 3.47 | 4.2 | 0.73 |
| Example 10 | 2, 6 (67:33) | 5.43 | 5.46 | 0.03 | 840 | 0.05 | 0 | 100 | 3.47 | 4.2 | 0.73 |

As shown in Table 6, when comparing Examples 2, 3 and 13, and Comparative Examples 1, 2 and 3 having the same combination of the N-type organic semiconductor and the P-type organic semiconductor, it can be seen that the difference between the ionization potential of the P-type organic semiconductor and the apparent ionization potential of the bulk hetero structure can be suppressed from being 0.5 eV or more (more specifically 0.3 eV or more) by changing the compositional ratio (volume ratio) of the N-type organic semiconductor and the P-type organic semiconductor. Further, it can be seen that sensitivity is not deteriorated before and after the light irradiation by suppressing the apparent ionization potential of the bulk hetero structure of the photoelectric conversion layer from being 5.80 eV or more. Further, the preferable range of the compositional ratio of the N-type organic semiconductor and the P-type organic semiconductor, which can suppress the difference between the ionization potential of the P-type organic semiconductor and the apparent ionization potential of the bulk hetero structure from being 0.5 eV or more, cannot be uniformly determined because the range is changed depending on the kind or combination of the N-type organic semiconductor and the P-type organic semiconductor, but it is preferred that the volume ratio of the N-type organic semiconductor (Compound 2) in combination of Compounds 2, 3 and 4 is 70% or less.

As shown in Table 7, when comparing Examples 9 and 10 and Comparative Example 4, it can be seen that, even though one kind of compound of the P-type organic semiconductor is used, it is possible to suppress the difference between the ionization potential of the P-type organic semiconductor and the apparent ionization potential of the bulk hetero structure from being 0.5 eV or more (more specifically 0.3 eV or more), as in the case of using two kinds. Further, it can be seen that sensitivity is not deteriorated before and after the light irradiation by suppressing the apparent ionization potential of the bulk hetero structure of the photoelectric conversion layer from being 5.80 eV or more.

TABLE 8

| Sample | Compound of the photoelectric conversion layer (vol %) | Ip 1 of the P-type organic semiconductor (eV) | Ip 2 of the bulk hetero structure (eV) | Ip 2 − Ip 1 (eV) | Fluorescent maximum wavelength of the bulk hetero structure (25° C.) (nm) | Fluorescent quantum yield of the bulk hetero structure (%) | Sensitivity deterioration ratio (%) | Relative sensitivity (%) | Ea2 of the P-type organic semiconductor (eV) | Ea1 of fullerene (eV) | Ea1 − Ea2 |
|---|---|---|---|---|---|---|---|---|---|---|---|
| Comparative Example 1 | 2, 3, 4 (88:10:2) | 5.52 | 6.08 | 0.56 | 740 | 3 | 30 | 70 | 3.4 | 4.2 | 0.8 |

TABLE 8-continued

| Sample | Compound of the photo-electric conversion layer (vol %) | Ip 1 of the P-type organic semi-conductor (eV) | Ip 2 of the bulk hetero structure (eV) | Ip 2 − Ip 1 (eV) | Fluorescent maximum wavelength of the bulk hetero structure (25° C.) (nm) | Fluorescent quantum yield of the bulk hetero structure (%) | Sensitivity deteri-oration ratio (%) | Relative sensi-tivity (%) | Ea2 of the P-type organic semi-conductor (eV) | Ea1 of ful-lerene (eV) | Ea1 − Ea2 |
|---|---|---|---|---|---|---|---|---|---|---|---|
| Comparative Example 3 | 2, 3, 4 (75:23:2) | 5.52 | 6.03 | 0.51 | 748 | 1.5 | 10 | 80 | 3.4 | 4.2 | 0.8 |
| Example 6 | 2, 4, 8 (75:2:23) | 5.2 | 5.6 | 0.4 | 750 | 0.8 | 0 | 85 | 3.4 | 4.2 | 0.8 |
| Example 4 | 2, 4, 6 (75:2:23) | 5.58 | 5.78 | 0.2 | 760 | 0.2 | 0 | 90 | 3.47 | 4.2 | 0.73 |
| Example 3 | 2, 3, 4 (50:48:2) | 5.52 | 5.7 | 0.18 | 760 | 0.1 | 0 | 100 | 3.4 | 4.2 | 0.8 |
| Example 14 | 2, 4, 11 (75:2:23) | 5.52 | 5.6 | 0.08 | 840 | 0.05 | 0 | 100 | 3.32 | 4.2 | 0.88 |

As shown in Table 8, when comparing Examples 3, 4, 6 and 14 and Comparative Examples 1 and 3, it can be seen that deterioration of sensitivity before and after the light irradiation can be suppressed by having the fluorescent maximum wavelength of the bulk hetero structure at 750 nm or more. Further, it can be seen that relative sensitivity can be maintained at 90% or more by making the fluorescent maximum wavelength of the bulk hetero structure of 760 nm or more.

As shown in Table 10, it can be seen that if a difference between Ea2 of the P-type organic semiconductor and Ea1 of the N-type organic semiconductor is more than 0.2 eV in Examples 11 and 12, deterioration of sensitivity before and after the light irradiation can be suppressed.

As described above, the photoelectric conversion device according to the embodiment is formed by stacking the first electrode layer, the photoelectric conversion layer including the organic material, and the second electrode layer on the substrate, in which the photoelectric conversion layer has the bulk hetero structure of the P-type organic semiconductor and the N-type organic semiconductor, and the difference between the ionization potential of the P-type organic semiconductor and the apparent ionization potential of the bulk hetero structure is 0.50 eV or less.

TABLE 9

| Sample | Compound of the photo-electric conversion layer (vol %) | Ip 1 of the P-type organic semi-conductor (eV) | Ip 2 of the bulk hetero structure (eV) | Ip 2 − Ip 1 (eV) | Fluorescent maximum wavelength of the bulk hetero structure (25° C.) (nm) | Fluorescent quantum yield of the bulk hetero structure (%) | Sensitivity deteri-oration ratio (%) | Relative sensi-tivity (%) | Ea2 of the P-type organic semi-conductor (eV) | Ea1 of ful-lerene (eV) | Ea1 − Ea2 |
|---|---|---|---|---|---|---|---|---|---|---|---|
| Comparative Example 1 | 2, 3, 4 (88:10:2) | 5.52 | 6.08 | 0.56 | 740 | 3 | 30 | 70 | 3.4 | 4.2 | 0.8 |
| Comparative Example 3 | 2, 3, 4 (75:23:2) | 5.52 | 6.03 | 0.51 | 748 | 1.5 | 10 | 80 | 3.4 | 4.2 | 0.8 |
| Example 2 | 2, 3, 4 (67:31:2) | 5.52 | 5.8 | 0.28 | 750 | 0.8 | 0 | 85 | 3.4 | 4.2 | 0.8 |
| Example 3 | 2, 3, 4 (50:48:2) | 5.52 | 5.7 | 0.18 | 760 | 0.1 | 0 | 100 | 3.4 | 4.2 | 0.8 |
| Example 8 | 2, 4, 5 (83:2:15) | 5.52 | 5.7 | 0.18 | 840 | 0.05 | 0 | 100 | 3.32 | 4.2 | 0.88 |

As shown in Table 9, when comparing Examples 2, 3 and 8 and Comparative Examples 1 and 3, it can be seen that deterioration of sensitivity before and after the light irradiation can be suppressed by making the fluorescent quantum yield of the bulk hetero structure of 1.0% or less. Further, it can be seen that relative sensitivity can be maintained in 90% or more by making the fluorescent quantum yield of the bulk hetero structure of 0.1% or less.

TABLE 10

| Sample | Compound of the photo-electric conversion layer (vol %) | Ip 2 of the P-type organic semi-conductor (eV) | Ip 2 of the bulk hetero structure (eV) | Ip 2 − Ip 1 (eV) | Fluorescent maximum wavelength of the bulk hetero structure (25° C.) (nm) | Fluorescent quantum yield of the bulk hetero structure (%) | Sensitivity deteri-oration ratio (%) | Relative sensi-tivity (%) | Ea2 of the P-type organic semi-conductor (eV) | Ea1 of ful-lerene (eV) | Ea1 − Ea2 |
|---|---|---|---|---|---|---|---|---|---|---|---|
| Example 12 | 2, 4, 9 (75:2:23) | 5.65 | 5.7 | 0.05 | 800 | 0.1 | 30 | 100 | 4.05 | 4.2 | 0.2 |
| Example 11 | 2, 4, 10 (75:2:23) | 5.62 | 5.65 | 0.03 | 840 | 0.05 | 0 | 100 | 3.9 | 4.2 | 0.3 |

Further, in the photoelectric conversion device of the embodiment, the difference between the ionization potential of the P-type organic semiconductor and the apparent ionization potential of the bulk hetero structure is 0.40 eV or less.

Further, in the photoelectric conversion device of the embodiment, the P-type organic semiconductor is a compound represented by the above-mentioned Formula (1).

Further, in the photoelectric conversion device of the embodiment, the N-type organic semiconductor is formed of fullerene or a fullerene derivative.

Further, the photoelectric conversion device of the embodiment has the electric charge blocking layer.

Further, in the photoelectric conversion device of the embodiment, fullerene or the fullerene derivative includes a fullerene multimer.

Further, in the photoelectric conversion device of the embodiment, the apparent ionization potential is 5.80 eV or less.

Further, in the photoelectric conversion device of the embodiment, the apparent ionization potential is 5.70 eV or less.

Further, in the photoelectric conversion device of the embodiment, the ionization potential of the P-type organic semiconductor is 5.20 eV or more.

Further, in the photoelectric conversion device of the embodiment, a difference in electron affinity of the P-type organic semiconductor and the fullerene is 0.20 eV or more.

Further, in the photoelectric conversion device of the embodiment, the P-type organic semiconductor is a dye type.

Further, in the photoelectric conversion device of the embodiment, a fluorescent maximum wavelength of the bulk hetero structure at 25° C. is 750 nm or more.

Further, in the photoelectric conversion device of the embodiment, the fluorescent maximum wavelength of the bulk hetero structure at 25° C. is 760 nm or more.

Further, in the photoelectric conversion device of the embodiment, a fluorescent quantum yield of the bulk hetero structure at 25° C. is 1.0% or less.

Further, in the photoelectric conversion device of the embodiment, the fluorescent quantum yield of the bulk hetero structure at 25° C. is 0.1% or less.

Further, in the photoelectric conversion device of the embodiment, the substrate includes an electric charge accumulation portion for accumulating electric charges generated in the photoelectric conversion layer, and a connection portion for transferring the electric charges of the photoelectric conversion layer to the electric charge accumulation portion.

Further, an imaging device of the embodiment uses the photoelectric conversion device.

According to the solid-state imaging device or the imaging device of the embodiment, sensitivity degradation caused by the light irradiation can be suppressed, thereby enabling an imaging of a subject with a high SN ratio.

INDUSTRIAL APPLICABILITY

Since the photoelectric conversion device and the imaging device according to the present invention can suppress sensitivity degradation caused by the light irradiation to obtain high photoelectric conversion efficiency, the device may be used as a solar cell, and the imaging device can be usefully mounted on an imaging equipment such as a digital still camera, a digital video camera, a camera for mobile phone and a camera for endoscopy.

The present invention is described in detail with reference to specific embodiments, but it is apparent to the person with ordinary skill in the art that various changes or modifications may be made without departing from the spirit and the scope of the present invention.

This application is based on Japanese Patent Application (Patent Application No. 2010-068954) filed on Mar. 24, 2010, and Japanese Patent Application (Patent Application No. 2010-254264) filed on Nov. 12, 2010, and the contents of which are incorporated herein by reference.

EXPLANATION OF REFERENCE NUMERALS

15: Photoelectric conversion layer
15a: Electric Charge blocking layer
100: Photoelectric conversion device
104: First electrode layer (lower electrode, pixel electrode)
108: Second electrode layer (upper electrode)
116: Signal reading circuit

The invention claimed is:

1. A photoelectric conversion device formed by stacking a first electrode layer, a photoelectric conversion layer including an organic material, and a second electrode layer on a substrate, wherein:

the photoelectric conversion layer has a bulk hetero structure of a P-type organic semiconductor and an N-type organic semiconductor;

the difference between the ionization potential of the P-type organic semiconductor and the apparent ionization potential of the bulk hetero structure is 0.50 eV or less;

the P-type organic semiconductor is a compound selected from the following Compounds 4, 5, 10 and 11:

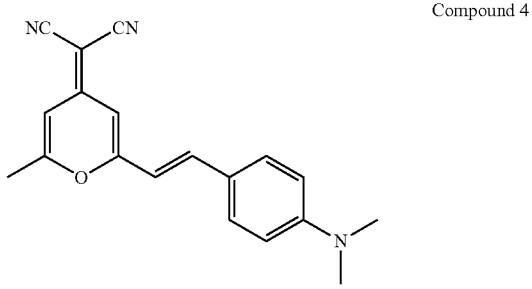

Compound 4

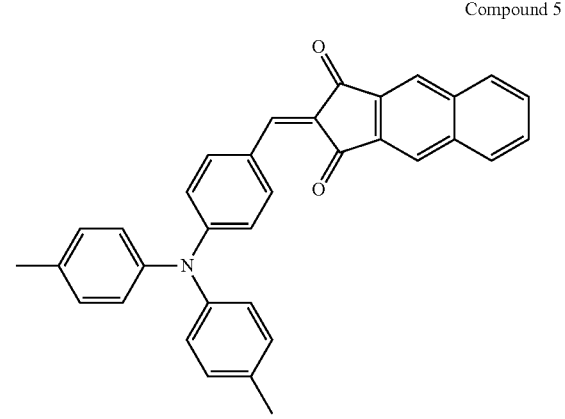

Compound 5

-continued

Compound 10

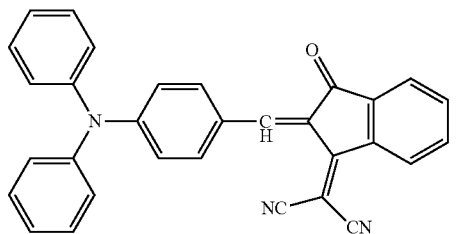

Compound 11

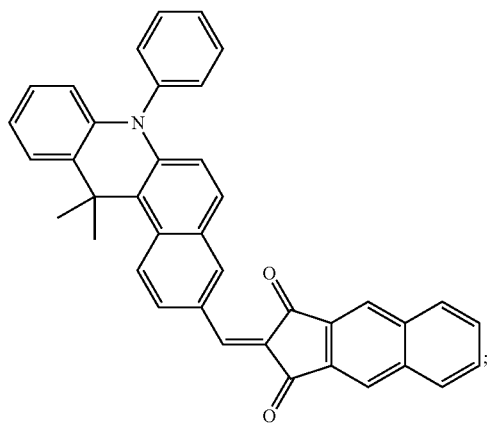

the N-type organic semiconductor is fullerene $C_{60}$ or a multimer of fullerene $C_{60}$;

the fluorescent maximum wavelength of the bulk hetero structure at 25° C. is 760 nm or more;

the fluorescent quantum yield of the bulk hetero structure at 25° C. is 0.2% or less; and the difference in electron affinity between the P-type organic semiconductor and the fullerene $C_{60}$ or the multimer of fullerene $C_{60}$ is 0.30 eV or more.

2. The photoelectric conversion device according to claim 1, wherein the difference between the ionization potential of the P-type organic semiconductor and the apparent ionization potential of the bulk hetero structure is 0.40 eV or less.

3. The photoelectric conversion device according to claim 1, comprising an electric charge blocking layer.

4. The photoelectric conversion device according to claim 1, wherein the N-type organic semiconductor is a multimer of fullerene $C_{60}$.

5. The photoelectric conversion device according to claim 1, wherein the apparent ionization potential of the bulk hetero structure is 5.80 eV or less.

6. The photoelectric conversion device according to claim 5, wherein the ionization potential of the P-type organic semiconductor is 5.20 eV or more.

7. The photoelectric conversion device according to claim 1, wherein the apparent ionization potential of the bulk hetero structure is 5.70 eV or less.

8. The photoelectric conversion device according to claim 5, wherein the P-type organic semiconductor is a dye type.

9. The photoelectric conversion device according to claim 1, wherein the fluorescent quantum yield of the bulk hetero structure at 25° C. is 0.1% or less.

10. The photoelectric conversion device according to claim 1, wherein the substrate includes an electric charge accumulation portion accumulating electric charges generated in the photoelectric conversion layer, and a connection portion transferring the electric charges of the photoelectric conversion layer to the electric charge accumulation portion.

11. An imaging device comprising the photoelectric conversion device according to claim 10.

* * * * *